(12) United States Patent
Peng et al.

(10) Patent No.: US 12,476,182 B2
(45) Date of Patent: Nov. 18, 2025

(54) PLANARIZATION STRUCTURE FOR MIM TOPOGRAPHY

(71) Applicant: Taiwan Semiconductor Manufacturing Company, Ltd., Hsinchu (TW)

(72) Inventors: Liang-Shiuan Peng, Taipei (TW); Chih-Hung Lu, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 192 days.

(21) Appl. No.: 18/150,299

(22) Filed: Jan. 5, 2023

(65) Prior Publication Data
US 2024/0145377 A1   May 2, 2024

Related U.S. Application Data

(60) Provisional application No. 63/420,203, filed on Oct. 28, 2022.

(51) Int. Cl.
*H01L 23/522*   (2006.01)
*H01L 21/768*   (2006.01)
(Continued)

(52) U.S. Cl.
CPC .... *H01L 23/5223* (2013.01); *H01L 21/76819* (2013.01); *H10D 1/696* (2025.01); *H10D 88/00* (2025.01); *H01L 24/13* (2013.01); *H01L 2224/05558* (2013.01); *H01L 2224/05572* (2013.01); *H01L 2224/05666* (2013.01); *H01L 2224/05681* (2013.01); *H01L 2224/05686* (2013.01); *H01L 2224/13021* (2013.01);
(Continued)

(58) Field of Classification Search
CPC .......... H01L 23/5223; H01L 21/76871; H01L 21/76873; H01L 21/76874; H01L 21/7688; H01L 21/76883; H01L 21/7687; H01L 21/76829; H01L 21/76832; H01L 21/36834; H01L 21/76837; H01L 21/76838; H01L 21/7684; H01L 21/76841; H10D 1/60; H10D 1/62; H10D 1/68; H10D 84/811; H10D 84/813
See application file for complete search history.

(56) References Cited

U.S. PATENT DOCUMENTS 7,592,660 B2    9/2009  Nagai et al.
2006/0060972 A1  3/2006  Kim et al.
(Continued)

*Primary Examiner* — Thanhha S Pham
(74) *Attorney, Agent, or Firm* — Eschweiler & Potashnik, LLC

(57) ABSTRACT

Some embodiments relate to an integrated chip including a first metal insulator metal (MIM) capacitor disposed over a substrate. The integrated chip further includes a second MIM capacitor disposed over the substrate. The first MIM capacitor has a first outer sidewall facing a second outer sidewall of the second MIM capacitor. A dielectric structure is arranged over and laterally between the first MIM capacitor and the second MIM capacitor. A base conductive layer is arranged between the first MIM capacitor and the second MIM capacitor and has a substantially flat upper surface. A metal core arranged on the substantially flat upper surface of the base conductive layer.

20 Claims, 26 Drawing Sheets

(51) Int. Cl.
  *H10D 1/68* (2025.01)
  *H10D 88/00* (2025.01)
  *H01L 23/00* (2006.01)

(52) U.S. Cl.
  CPC .................. *H01L 2224/401* (2013.01); *H01L 2924/04941* (2013.01); *H01L 2924/04953* (2013.01)

(56) References Cited

U.S. PATENT DOCUMENTS

| | | |
|---|---|---|
| 2016/0276426 A1 | 9/2016 | Yang et al. |
| 2017/0148671 A1 | 5/2017 | Kao et al. |
| 2022/0310513 A1* | 9/2022 | Bak .................. H01L 21/76877 |

* cited by examiner

PLANARIZATION STRUCTURE FOR MIM TOPOGRAPHY

REFERENCE TO RELATED APPLICATION

This application claims the benefit of U.S. Provisional Application No. 63/420,203, filed on Oct. 28, 2022, the contents of which are hereby incorporated by reference in their entirety.

BACKGROUND

Integrated circuits (ICs) are formed on semiconductor dies comprising millions or billions of transistor devices. The transistor devices are configured to act as switches and/or to produce power gains so as to enable logical functionality. ICs also comprise passive devices used to control gains, time constants, and other IC characteristics. One type of passive device is a metal-insulator-metal (MIM) capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
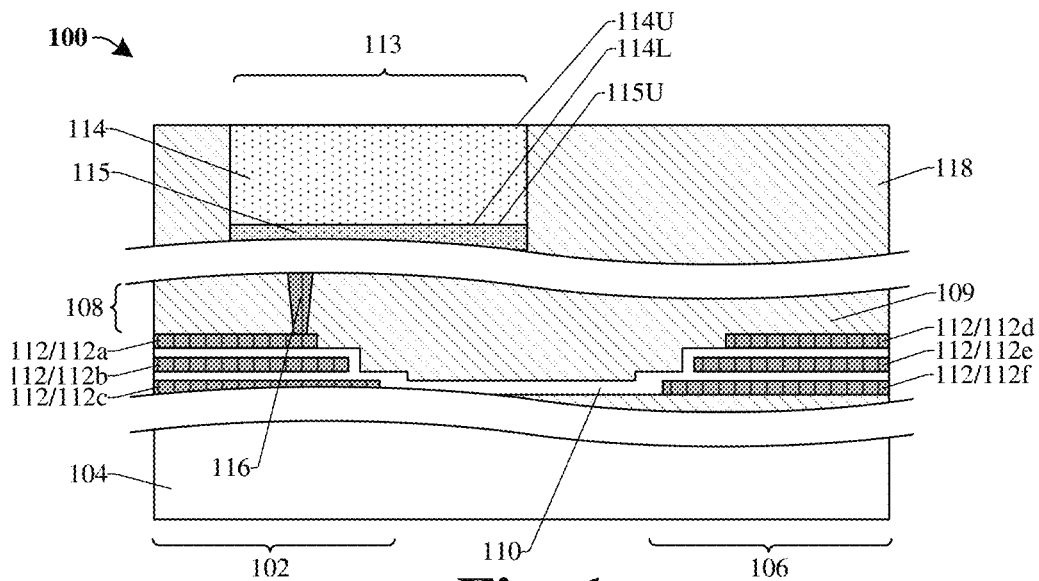
FIG. 1 illustrates a cross-sectional view of some embodiments of an integrated chip comprising a conductive structure that has a metal core disposed over a base conductive layer including a substantially flat upper surface arranged over a MIM capacitor array.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal insulator metal (MIM) capacitor array contains a plurality of MIM capacitors spaced in a capacitor region. During fabrication, the MIM capacitors may be formed over a substrate. After forming the plurality of MIM capacitors, a dielectric may be formed on and between the plurality of MIM capacitors. A plurality of wire levels comprising a conductive interconnect may be subsequently formed onto the dielectric over and/or laterally between neighboring ones of the plurality of MIM capacitors. The plurality of wire levels can be formed using a variety of methods, including a damascene process and an electro-chemical plating (ECP) process. The ECP process may be more cost effective than the damascene process, and therefore may be preferable.

When performing the ECP process, a barrier layer and a seed layer are formed over the dielectric structure. A photoresist is then applied and developed on top of the seed layer. The developed photoresist has sidewalls that define an opening that is over and/or between neighboring MIM capacitors. An electroplating process is then performed to form a metal core onto the seed layer and between the sidewalls of the developed photoresist. The photoresist and unused portions of the seed layer are subsequently removed to define a conductive structure. An additional dielectric is then formed over the conductive structure.

However, because of the topology of the plurality of MIM capacitors the dielectric may have an uneven upper surface that dips between neighboring MIM capacitors. When the seed layer is formed onto the uneven upper surface of the dielectric, it will cause the seed layer to have angled surfaces. Lithographic radiation used to develop the photoresist may reflect laterally off of the angled surfaces of the seed layer causing errors in the development of the photoresist. The errors cause the resulting conductive structures to be formed improperly or be missing. The improperly formed conductive structures can result in lower reliability and/or yield.

The present disclosure provides for techniques to form an integrated chip having a conductive structure comprising a metal core that is disposed onto a substantially flat upper surface of an underlying conductive base layer arranged between underlying MIM capacitors. The substantially flat surface of the conductive base layer may be formed using a variety of methods, including performing a planarization process on the dielectric structure, adding a planarization layer to the dielectric structure, and performing an additional ECP process across the un-patterned seed layer. These techniques result in the conductive base layer having a substantially flat upper surface that reduces erroneous reflections of lithographic radiation off of the seed layer, thereby mitigating the errors in forming the conductive structures.

FIG. 1 illustrates a cross-sectional view 100 of some embodiments of an integrated chip comprising a conductive structure that has a metal core disposed over a base conductive layer including a substantially flat upper surface arranged over a MIM capacitor array.

As shown in the cross-sectional view 100 of FIG. 1, a first MIM capacitor 102 is positioned over a substrate 104. A second MIM capacitor 106 is laterally spaced from the first MIM capacitor 102 by a dielectric structure 108. In some embodiments, the dielectric structure 108 comprises a first insulator 109 extending over and between the first MIM capacitor 102 and the second MIM capacitor 106. In some embodiments, the first insulator 109 has an upper surface (not shown) that is substantially flat, while in other embodiments the upper surface of the first insulator 109 is not flat (e.g., may be stepped, at least partially angled, etc.).

The first MIM capacitor 102 and the second MIM capacitor 106 respectively comprise a plurality of conductive layers 112 spaced by an insulative material 110. For example, in some embodiments, the first MIM capacitor 102 may comprise a first conductive layer 112a, a second conductive layer 112b, and a third conductive layer 112c separated from one another by the insulative material 110, while the second MIM capacitor 106 may comprise a fourth conductive layer 112d, a fifth conductive layer 112e, and a sixth conductive layer 112f separated from one another by the insulative material 110. In some embodiments, the first MIM capacitor 102 and the second MIM capacitor 106 may have more or less conductive layers. In some embodiments, the insulative material 110 extends from the first MIM capacitor 102 to the second MIM capacitor 106.

A conductive structure 113 is arranged vertically above the first MIM capacitor 102 and the second MIM capacitor 106. The conductive structure 113 comprises a metal core 114 separated from the first insulator 109 by a base conductive layer 115. In some embodiments, the base conductive layer 115 may comprise a seed layer. The base conductive layer 115 comprises a substantially flat upper surface 115U facing away from the substrate 104. In some embodiments, the base conductive layer 115 may comprise a lower surface (not shown) that is substantially flat, while in other embodiments the lower surface of the base conductive layer 115 may not be flat (e.g., may be stepped, at least partially angled, etc.). The metal core 114 comprises a substantially flat upper surface 114U and a substantially flat lower surface 114L. In some embodiments, the conductive structure 113 is electrically coupled to the first MIM capacitor 102 through capacitor vias 116. A second insulator 118 surrounds outer sidewalls of the conductive structure 113.

The substantially flat upper surface 115U of the base conductive layer 115 improves the process window of a lithography process used to form the conductive structure 113 (e.g., the metal core 114). For example, because the flat upper surface 115U of the base conductive layer 115 is substantially flat, radiation from the lithography process will not reflect off of angled surfaces of the base conductive layer 115 to erroneously expose a photoresist (not shown) disposed on the base conductive layer 115. By reducing the cause of erroneous reflection, improper development of the photoresist can be mitigated leading to a lower number of errors in the final layout of the conductive structure 113.

Figure 2A:
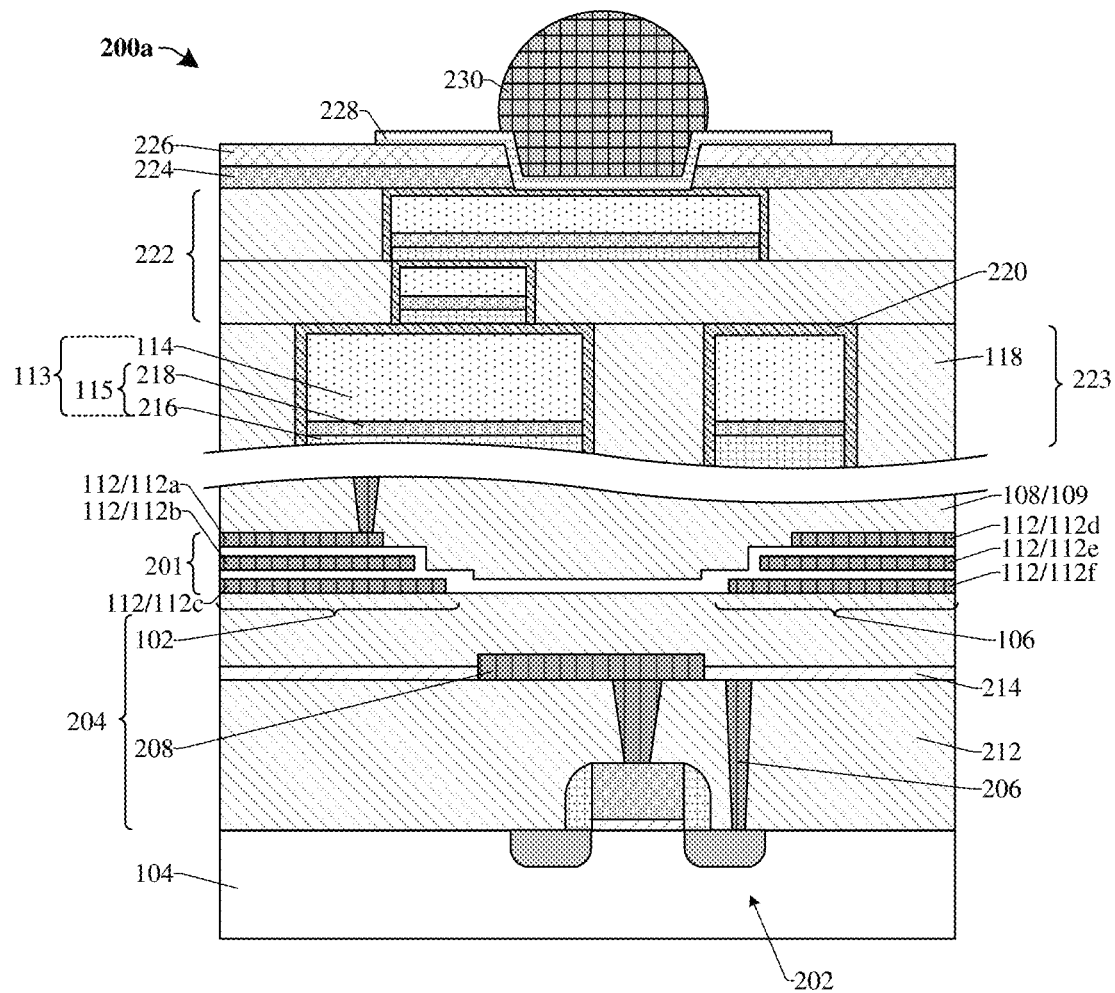
FIGS. 2A and 2B illustrate cross-sectional views of some embodiments of an integrated chip comprising a conductive structure that has a metal core disposed over a base conductive layer including a substantially flat upper surface arranged over a MIM capacitor array.
Figure 2B:
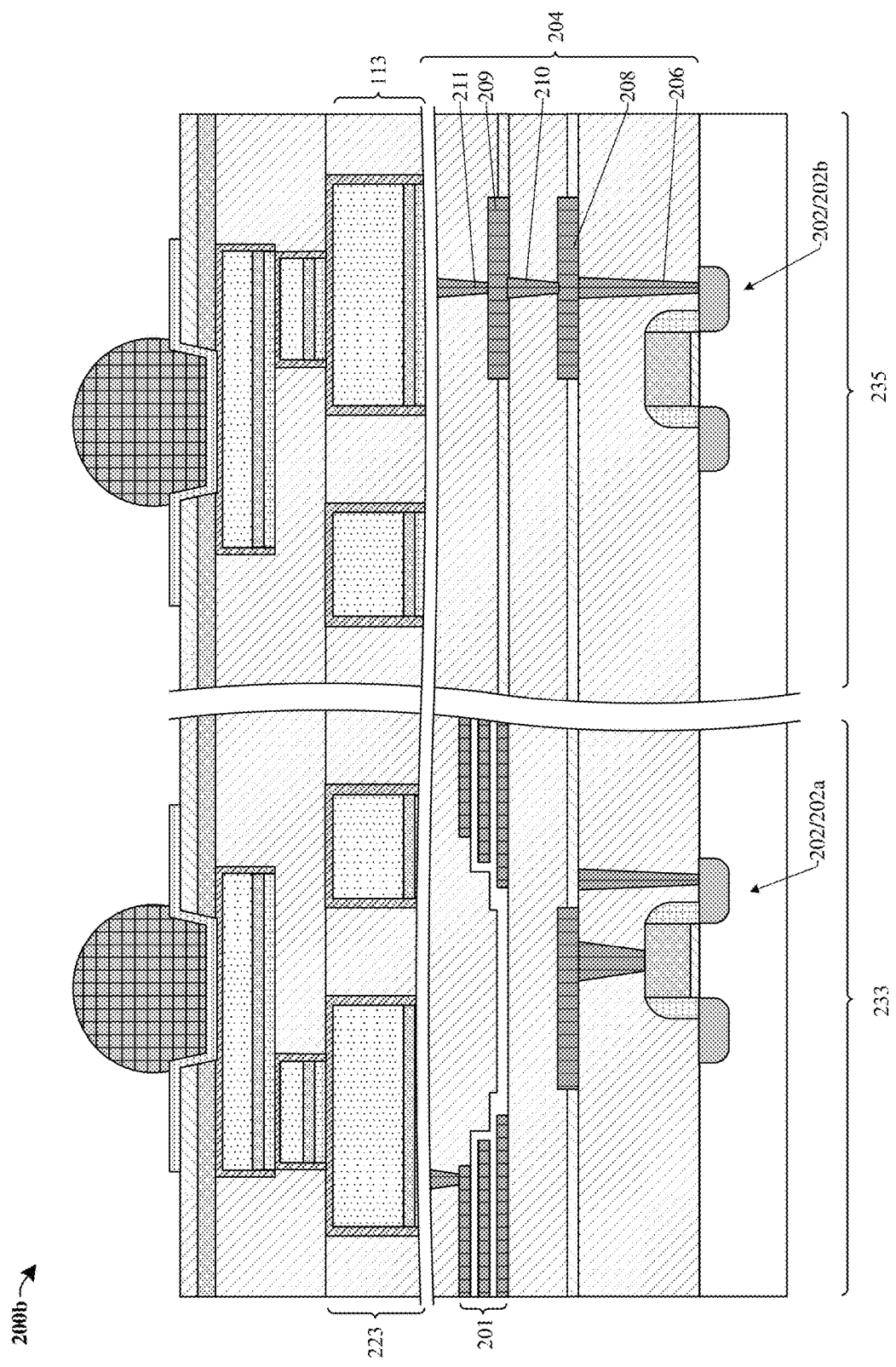

FIGS. 2A and 2B illustrate cross-sectional views 200a, 200b of some embodiments of an integrated chip comprising a conductive structure that has a metal core disposed over a base conductive layer including a substantially flat upper surface arranged over a MIM capacitor array.

As shown in the cross-sectional view 200a of FIG. 2A, in some embodiments, a plurality of semiconductor devices 202 are disposed on and/or within the substrate 104 beneath the plurality of MIM capacitors 201. The plurality of semiconductor devices 202 are electrically coupled to an interconnect structure 204 through a plurality of contacts 206. The interconnect structure 204 comprises a plurality of interconnect wires 208 and a plurality of interconnect vias (not shown) surrounded by one or more dielectric layers 212 and one or more etch stop layers 214. In some embodiments, the interconnect structure 204 is electrically coupled to the plurality of MIM capacitors 201.

The conductive structure 113 comprises a base conductive layer 115 and a metal core 114. In some embodiments, the base conductive layer 115 comprises a first barrier layer 216 extending along a bottom of the conductive structure 113 and a seed layer 218 disposed between the first barrier layer 216 and the metal core 114. In some embodiments, the seed layer 218 continuously extends between the first barrier layer 216 and the metal core 114. In some embodiments, the metal core 114 has a bottommost surface that overlies a top of the seed layer 218.

In some embodiments, a second barrier layer 220 surrounds the metal core 114, the seed layer 218, and/or the first barrier layer 216. In further embodiments, the second barrier layer 220 extends to a bottom surface of the first barrier layer 216. In other embodiments, the metal core 114 directly contacts the second insulator 118. In some embodiments, a bottommost surface of the seed layer 218 is flat and extends between opposing outermost sidewalls of the conductive structure 113.

In some embodiments, the conductive structure 113, first barrier layer 216, and the second insulator 118 together are a first wire level 223 of a plurality of wire levels. In some embodiments, one or more additional wire levels 222 of the plurality of wire levels are electrically coupled to a first wire level 223 comprising the conductive structure 113 and the second insulator 118. In some embodiments, the one or more additional wire levels 222 comprise conductive structures, barrier layers, and insulators. In some embodiments, the conductive structures of the one or more additional wire levels 222 are or comprise a same material as the conductive structure 113 of the first wire level 223. In other embodiments, the conductive structures of the one or more additional wire levels 222 are or comprise one or more different materials than the conductive structure 113 of the first wire level 223.

In some embodiments, one or more passivation layers 224, 226 are formed on the one or more additional wire levels 222. In some embodiments, the one or more passivation layers 224, 226 are or comprise a nitride (e.g., silicon nitride), a carbide (e.g., silicon carbide), an oxide, or the like, or some combination of the above listed materials. In some embodiments, a plurality of under-bump metallurgy (UBM) structures 228 extend through the one or more passivation layers 224, 226 and directly contact the additional wire levels 222. In some embodiments, the plurality of UBM structures 228 include a diffusion barrier layer and a seed layer. The diffusion barrier layer may also function as an adhesion layer (or a glue layer), in some embodiments. The diffusion barrier layer may comprise tantalum, tantalum nitride, titanium, titanium nitride, or combination thereof. The seed layer comprises a material that is configured to enable deposition of metal posts, solder bumps, or the like. In some embodiments, a plurality of solder bumps 230 are formed on the plurality of UBM structures 228.

As shown in the cross-sectional view 200b of FIG. 2B, in some embodiments, the integrated chip comprises a capacitor region 233 and a logic region 235. The plurality of MIM capacitors 201 are within the capacitor region 233, and are not within the logic region 235. In some embodiments, the plurality of semiconductor devices 202 are within both the capacitor region 233 and the logic region 235. In some embodiments, the plurality of semiconductor devices 202 may comprise a transistor device (e.g., a planar FET, a FinFET, a gate-all-around (GAA) device, etc.). In some embodiments, the interconnect structure 204 coupled to the semiconductor devices 202/202b within the logic region 235 extends above the plurality of MIM capacitors 201. Additional wires 209 of the plurality of interconnect wires 208 and additional vias 211 of the plurality of interconnect vias 210 are formed at a height level with the plurality of MIM capacitors 201. In further embodiments, the additional vias 211 are electrically coupled to the conductive structure 113 of the first wire level 223.

Figure 3A:
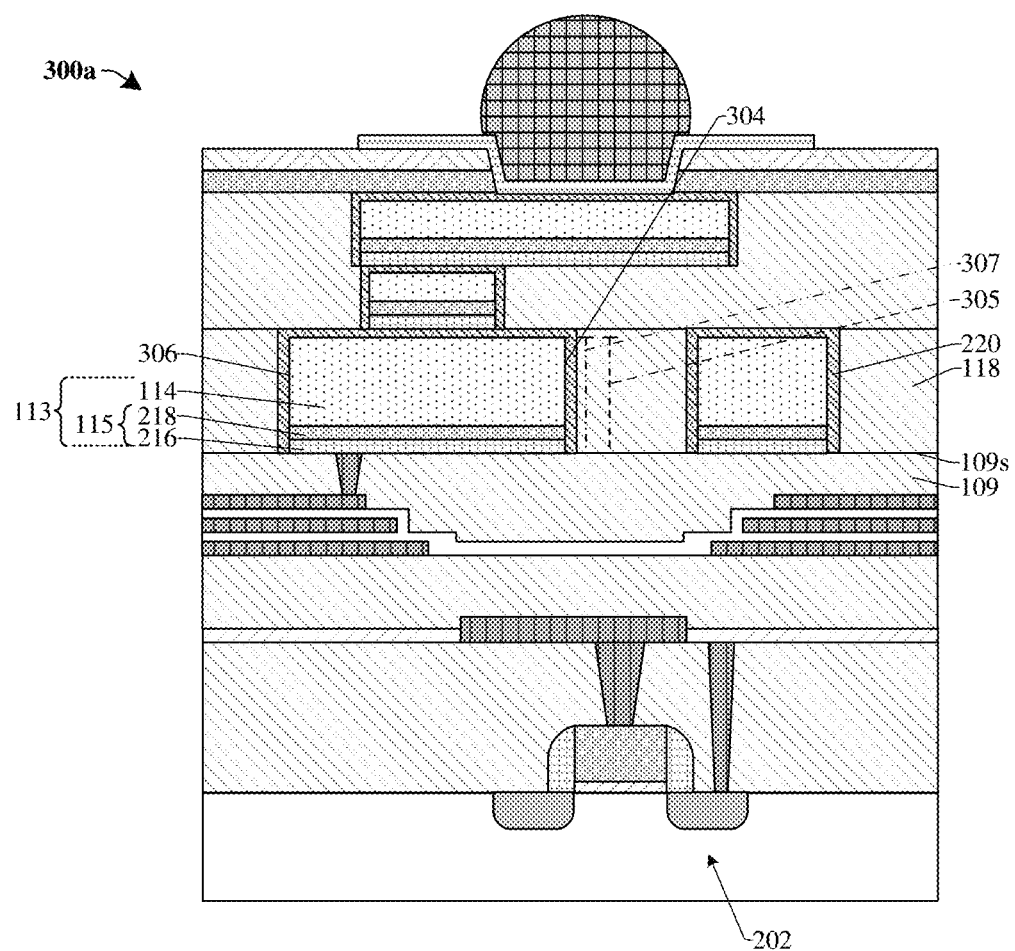
FIGS. 3A and 3B illustrate cross-sectional views of some embodiments of an integrated chip comprising a conductive structure that has a metal core disposed over a base conductive layer including a substantially flat upper surface arranged over a MIM capacitor array.
Figure 3B:
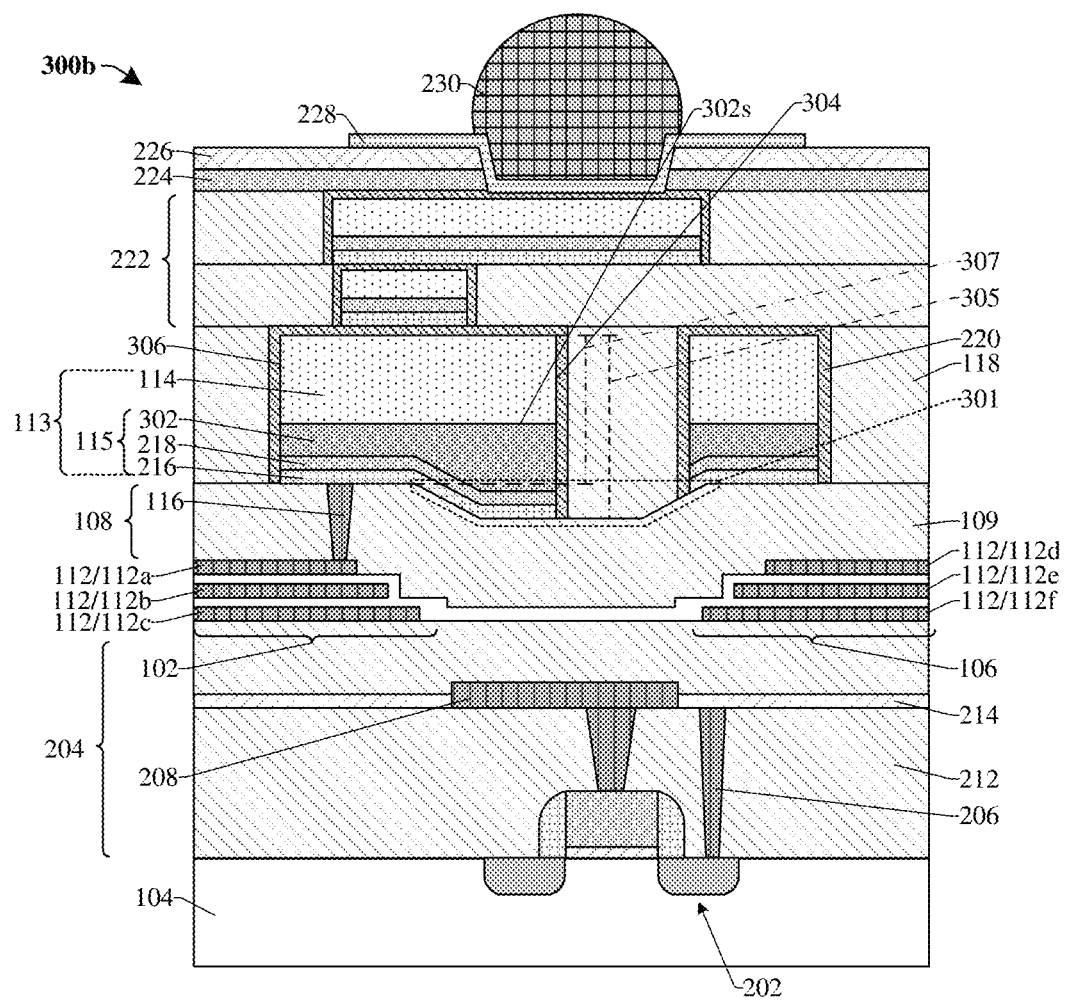

FIGS. 3A and 3B illustrate cross-sectional views of some embodiments of an integrated chip comprising a conductive structure that has a metal core disposed over a base conductive layer including a substantially flat upper surface arranged over a MIM capacitor array.

As shown in the cross-sectional view 300a of FIG. 3A, in some embodiments, the first insulator 109 has a substantially flat surface 109s. In some embodiments, the substantially flat surface 109s is planar. In some embodiments, a bottommost surface of the seed layer 218 is flat and extends from a first outermost sidewall 304 to a second outermost sidewall 306 of the conductive structure. In further embodiments, the first outermost sidewall 304 has a first height 305 that is equal to a second height 307 of the second outermost sidewall 306.

As shown in the cross-sectional view 300b of FIG. 3B, in some embodiments, the first insulator 109 does not have a substantially flat surface. A recess 301 (shown in phantom) extends into the first insulator 109 laterally between the first MIM capacitor 102 and the second MIM capacitor 106. The conductive structure 113 extends from over a top of the first insulator 109 to within the recess 301. The conductive structure 113 comprises the base conductive layer 115 and the metal core 114. In some embodiments, the base conductive layer 115 comprises the first barrier layer 216, the seed layer 218, and an intermediate conductive feature 302. In some embodiments, the intermediate conductive feature 302 has a bottom surface that extends into the recess 301 and a substantially flat top surface 302s. In some embodiments, the intermediate conductive feature 302 is or comprises a same material as the metal core 114. In some embodiments, the intermediate conductive feature 302 extends partially over the recess 301, such that the intermediate conductive feature 302 has multiple lower surfaces at different heights.

In some embodiments, the substantially flat top surface 302s of the intermediate conductive feature 302 extends between the first outermost sidewall 304 and the second outermost sidewall 306 of the conductive structure 113. The first outermost sidewall 304 is laterally between the first MIM capacitor 102 and the second MIM capacitor 106. In further embodiments, the first height 305 of the first outermost sidewall 304 is greater than the second height 307 of the second outermost sidewall 306.

Figure 4:
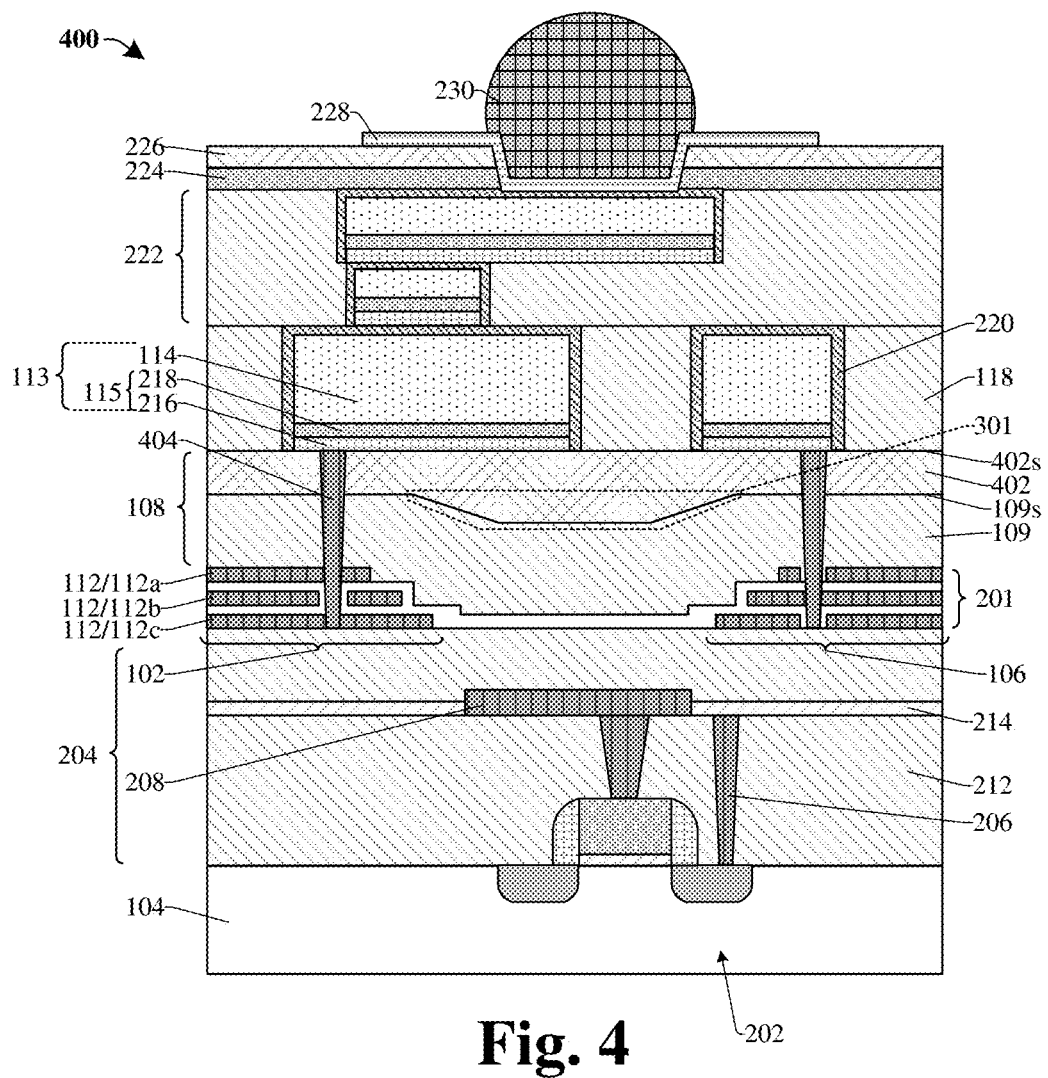
FIG. 4 illustrates a cross-sectional view of some embodiments of an integrated chip comprising a conductive structure that has a metal core disposed over a base conductive layer including a substantially flat upper surface arranged over a MIM capacitor array.

FIG. 4 illustrates a cross-sectional view of some embodiments of an integrated chip comprising a conductive structure that has a metal core disposed over a base conductive layer including a substantially flat upper surface arranged over a MIM capacitor array.

As shown in the cross-sectional view 400 of FIG. 4, in some embodiments, the dielectric structure 108 comprises the first insulator 109 and a planarization layer 402 separating the first insulator 109 from the conductive structure 113. The planarization layer 402 has a bottom surface that extends into the recess 301 (shown in phantom) in the first insulator 109. The planarization layer 402 has both the bottom surface facing the substrate 104, and a substantially flat surface 402s facing away from the recess 301. In some embodiments, the substantially flat surface 402s is planar.

In some embodiments, a plurality of through-capacitor vias 404 is used to electrically couple the conductive structure 113 to the plurality of MIM capacitors 201. The plurality of through-capacitor vias 404 extend through the plurality of MIM capacitors 201. In some embodiments, a through-capacitor via of the plurality of through-capacitor vias 404 may contact one or more conductive layers of the plurality of conductive layers 112. In further embodiments, the through-capacitor vias 404 extend through dummy conductive layer regions within the plurality of conductive layers to isolate the plurality of through-capacitor vias 404 from specific conductive layers of the plurality of conductive layers 112. For example, the through capacitor via may electrically couple to the first conductive layer 112a and the third conductive layer 112c but be isolated from the second conductive layer 112b. In some embodiments, the plurality of through-capacitor vias 404 are formed through one etching and one deposition process.

Figure 5A:
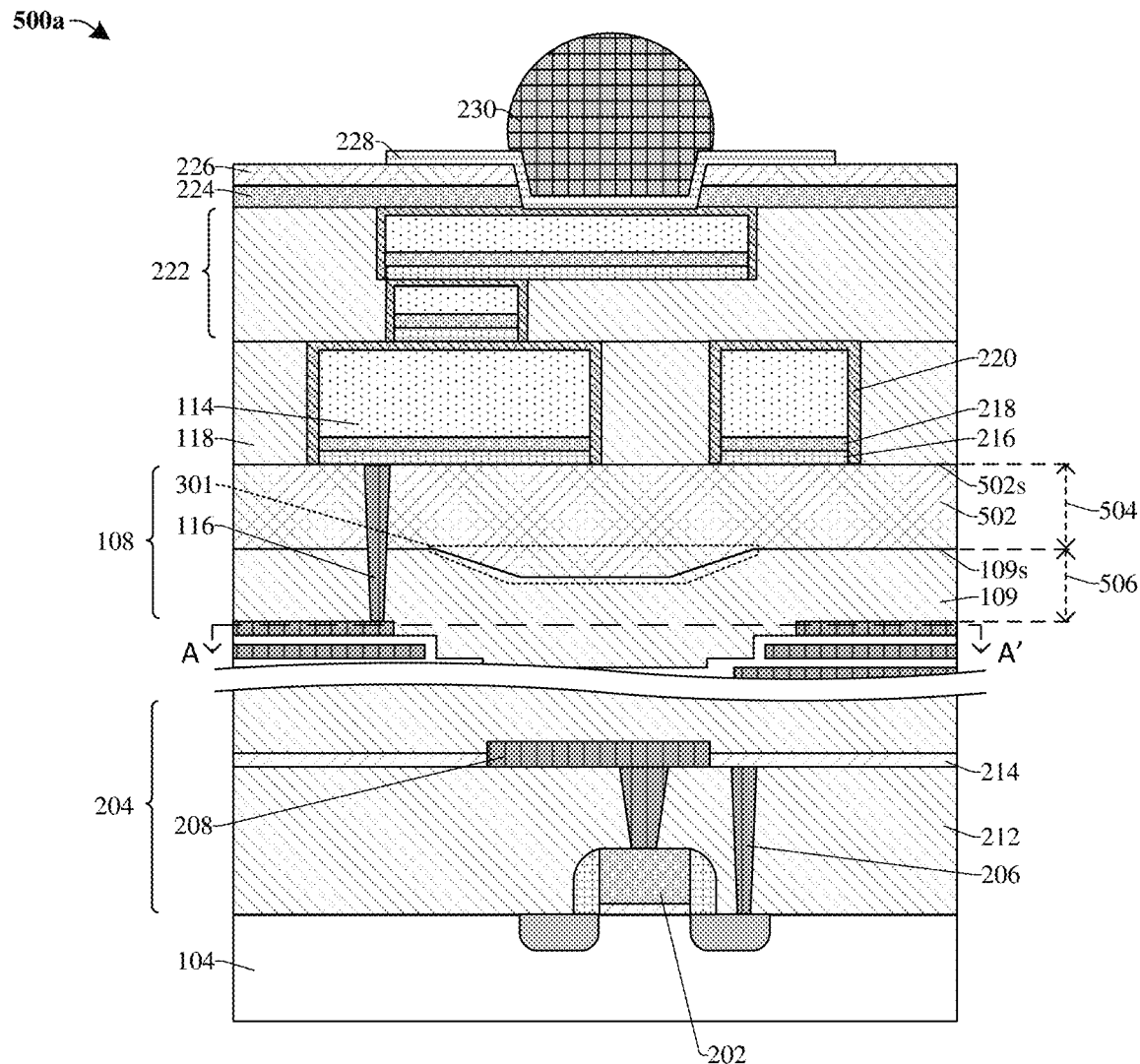
FIGS. 5A and 5B illustrate a cross-sectional view and a top view of some embodiments of an integrated chip comprising a conductive structure that has a metal core disposed over a base conductive layer including a substantially flat upper surface arranged over a MIM capacitor array.
Figure 5B:
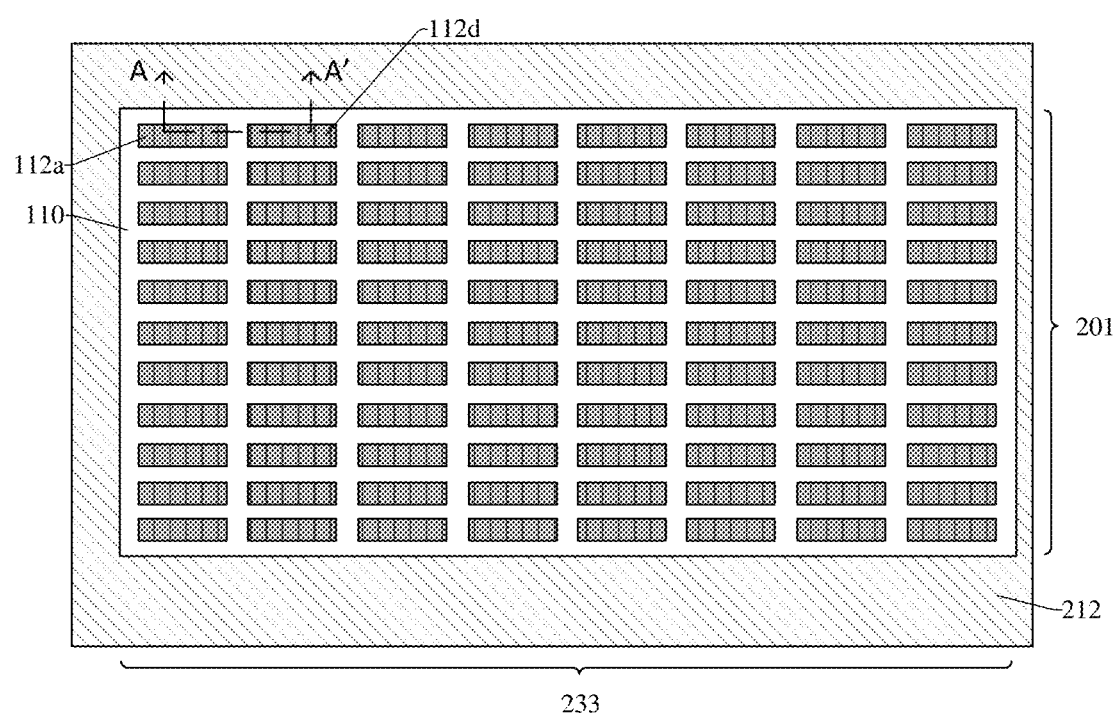

FIGS. 5A and 5B illustrate a cross-sectional view and a top view of some embodiments of an integrated chip comprising a conductive structure that has a metal core disposed over a base conductive layer including a substantially flat upper surface arranged over a MIM capacitor array.

As shown in the cross-sectional view 500a of FIG. 5A, in some embodiments, the dielectric structure 108 further comprises a second planarization layer 502 separating the first insulator 109 from the conductive structure 113. The second planarization layer 502 extends into the recess 301 (shown in phantom) in the first insulator 109. The second planarization layer 502 has a substantially flat surface 502s facing away from the substrate 104. In some embodiments, the second planarization layer 502 has a first thickness 504 and the first insulator 109 has a second thickness 506, and the first thickness 504 is greater than the second thickness 506.

As shown in the top view 500b of FIG. 5B, in some embodiments, the plurality of MIM capacitors 201 are arranged in an array in the capacitor region 233. The cross-sectional view 500a shown in FIG. 5A corresponds to the line shown from A to A' in FIG. 5B. Similarly, the top view 500b shown in FIG. 5B corresponds to the line shown from A to A' in FIG. 5A.

With reference to FIGS. 6 through 21, cross-sectional views of some embodiments of a method of forming an MIM capacitor array with a conductive structure formed over a substantially flat surface. Although FIGS. 6 through 21 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
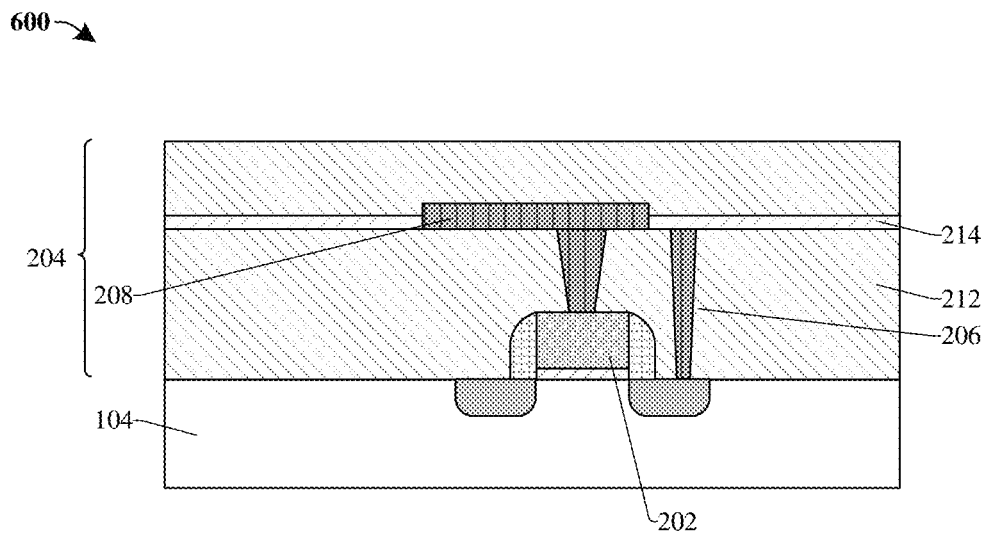
FIGS. 6 through 21 illustrate a series of cross-sectional views of some embodiments of a method of forming an integrated chip comprising a conductive structure that has a metal core disposed over a base conductive layer including a substantially flat upper surface arranged over a MIM capacitor array.

As shown in the cross-sectional view 600 of FIG. 6, the plurality of semiconductor devices 202 and an interconnect structure 204 are formed over a substrate 104. In some embodiments, the interconnect structure 204 comprises a plurality of interconnect wires 208 and a plurality of interconnect vias (not shown) electrically coupled to the plurality of semiconductor devices 202 through a plurality of contacts 206. The interconnect structure 204 is surrounded by a plurality of dielectric layers 212 and a plurality of etch stop layers 214. In some embodiments, the plurality of dielectric layers 212 are or comprise an oxide (e.g., silicon dioxide), a low-K dielectric material, an extreme low-K dielectric material, the like or any combination of the foregoing. In some embodiments, the plurality of etch stop layers 214 are or comprise silicon carbide, silicon nitride, the like, or any combination of the foregoing. In some embodiments, the plurality of interconnect wires 208 and the plurality of interconnect vias comprise one of tungsten (W), aluminum (Al), copper (Cu), or another conductive material.

Figure 7:
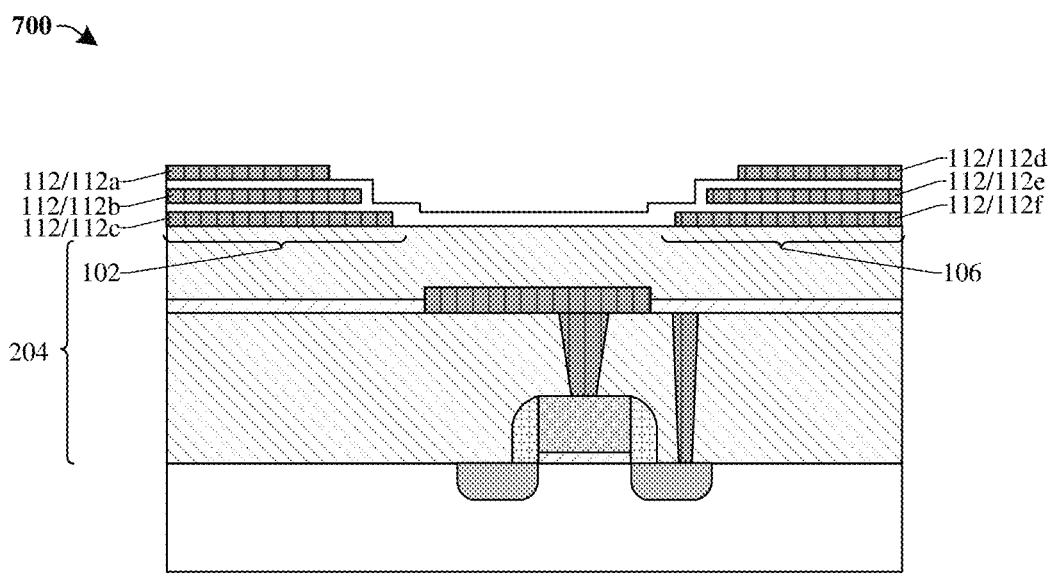

As shown in the cross-sectional view 700 of FIG. 7, the first MIM capacitor 102 and the second MIM capacitor 106 are formed over the interconnect structure 204. In some embodiments, the first MIM capacitor 102 and the second MIM capacitor 106 may, for example, be formed by depositing and patterning a plurality of conductive layers 112 and depositing and patterning of an insulative material 110 between the plurality of conductive layers 112. The depositing may, for example, be one of chemical vapor deposition (CVD), physical vapor deposition (PVD), atomic layer deposition (ALD), sputtering, electrochemical plating, electroless plating, some other suitable deposition process, or a combination of the foregoing. The patterning may, for example, be performed by forming and patterning a photoresist to expose portions of the plurality of conductive layers 112 and the insulative material 110 to be etched, and then etching the exposed portions of the integrated chip. In some embodiments, one or more dummy conductive areas (not shown) are formed within the plurality of conductive layers 112 to later aid in forming a through-capacitor via 404 extending through the first MIM capacitor 102 or the second MIM capacitor 106. There is a gap left between the first MIM capacitor 102 and the second MIM capacitor 106. In some embodiments, the plurality of conductive layers 112 are or comprise, for example, titanium (Ti), titanium nitride (TiN), tantalum (Ta), tantalum nitride (TaN), aluminum (Al), aluminum titanium (AlTi), some other conductive material, or a combination of the foregoing. In some embodiments, the insulative material 110 comprises one of a high-κ dielectric material, silicon dioxide ($SiO_2$), a metal oxide (e.g., ZrO2, Al2O3, HfO2, HfAlO, Ta2O5, or the like), or another suitable material. In some embodiments, the first MIM capacitor 102 and the second MIM capacitor 106 are two of a plurality of MIM capacitors 201 within a capacitor region 233.

Figure 8:
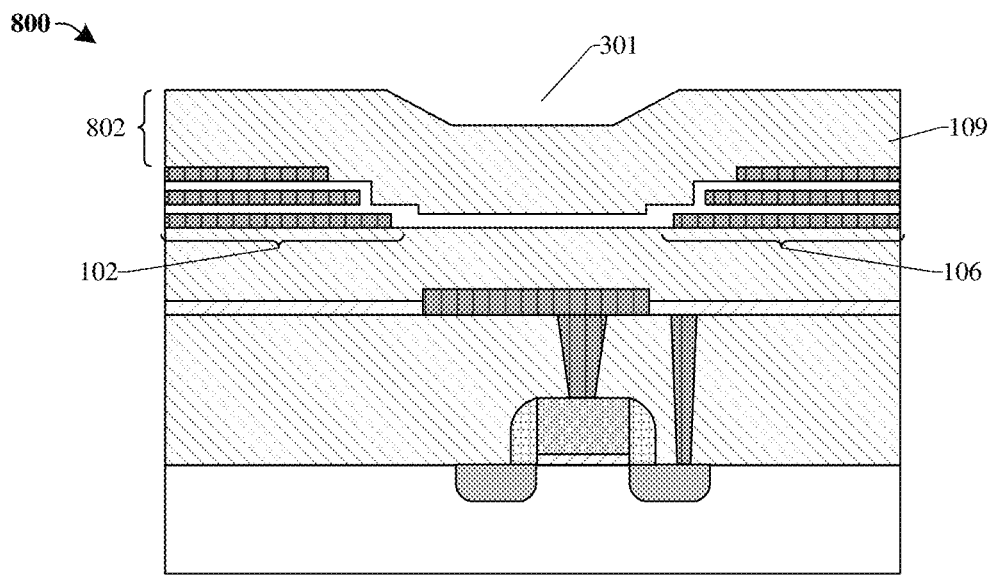

As shown in the cross-sectional view 800 of FIG. 8, the first insulator 109 is formed over and between the first MIM capacitor 102 and the second MIM capacitor 106. In some embodiments, the first insulator 109 may, for example, be formed by one or more deposition processes, such as a CVD process, or some other suitable process(es). The first insulator 109 is formed such that there is a recess 301 in a top surface of the first insulator 109 between the first MIM capacitor 102 and the second MIM capacitor 106. In some embodiments, the recess 301 is formed due to the uneven surface resulting from the spacing of the first MIM capacitor 102 and the second MIM capacitor 106. In some embodiments, the first insulator 109 is or comprises an oxide (e.g., silicon dioxide), a nitride (e.g., silicon nitride), a low-κ dielectric material, an extreme low-κ dielectric material, fiberglass, the like or any combination of the foregoing. In some embodiments, the first insulator 109 forms an initial dielectric structure 802.

Figure 9:
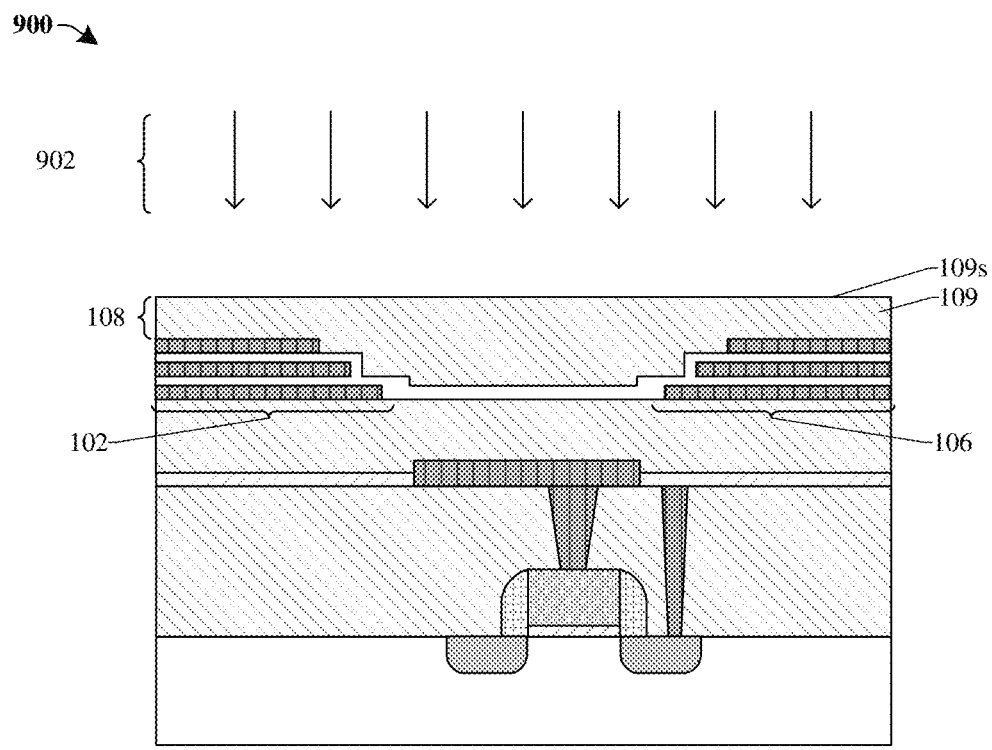

As shown in the cross-sectional view 900 of FIG. 9, a planarization process 902 is performed on the first insulator 109. The planarization process 902 results in the first insulator 109 having a substantially flat surface 109s extending over the first MIM capacitor 102 and the second MIM capacitor 106. In some embodiments, the planarization process 902 is a chemical-mechanical planarization (CMP) process or another planarization process (e.g., a mechanical grinding process, an etching process, or the like). In some embodiments, the initial dielectric structure 802 is modified to form the dielectric structure 108 having a substantially flat surface 109s continuously extending from directly over the first MIM capacitor 102 to directly over the second MIM capacitor 106.

Figure 10:
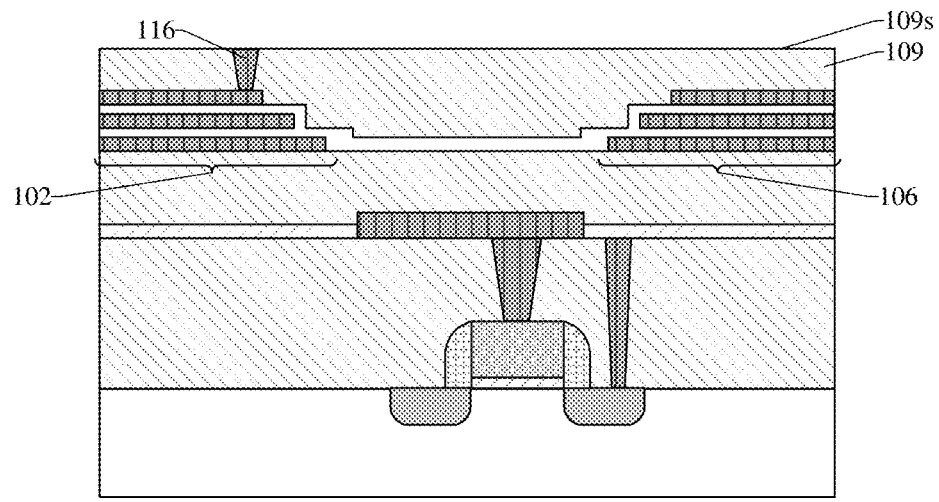

As shown in the cross-sectional view 1000 of FIG. 10, the plurality of capacitor vias 116 are formed in the first insulator 109. In some embodiments, the plurality of capacitor vias 116 are or comprise a metal, such as copper (Cu), titanium nitrate (TiN), tungsten (W), aluminum (Al), tantalum nitrate (TaN), the like, or any combination of the foregoing. In some embodiments, the first insulator 109 is patterned to form contact openings (not shown) exposing the first MIM capacitor 102 and the second MIM capacitor 106. The plurality of capacitor vias 116 are then formed in the contact openings. In some embodiments, the plurality of capacitor vias 116 are formed by depositing a conductive material within the contact openings and then using a planarization process to remove the conductive material from above the contact openings. In some embodiments, a same planarization process may be used in FIGS. 9 and 10. The depositing may, for example, be performed by CVD, PVD, ALD, sputtering, electrochemical plating, electroless plating, some other suitable deposition process, or a combination of the foregoing. The planarization may, for example, be performed by a CMP process or some other suitable process.

Figure 11:
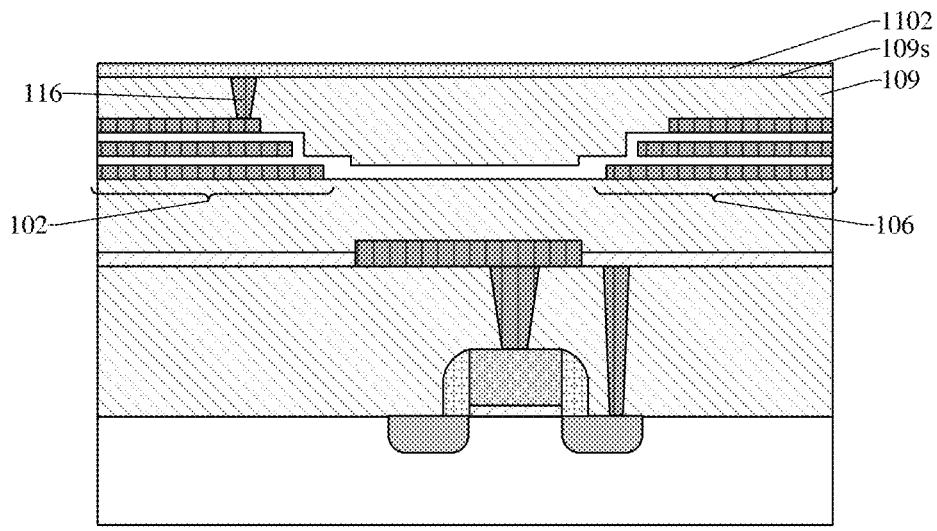

As shown in the cross-sectional view 1100 of FIG. 11, an un-patterned barrier layer 1102 is formed over the first insulator 109. In some embodiments, the un-patterned barrier layer 1102 is or comprises a metal, such as titanium (Ti) titanium nitrate (TiN), aluminum (Al), tantalum (Ta), tantalum nitrate (TaN), the like, or any combination of the foregoing. In some embodiments, due to the first insulator 109 having a substantially flat surface 109s, a top surface of the un-patterned barrier layer 1102 is also substantially flat.

Figure 12:
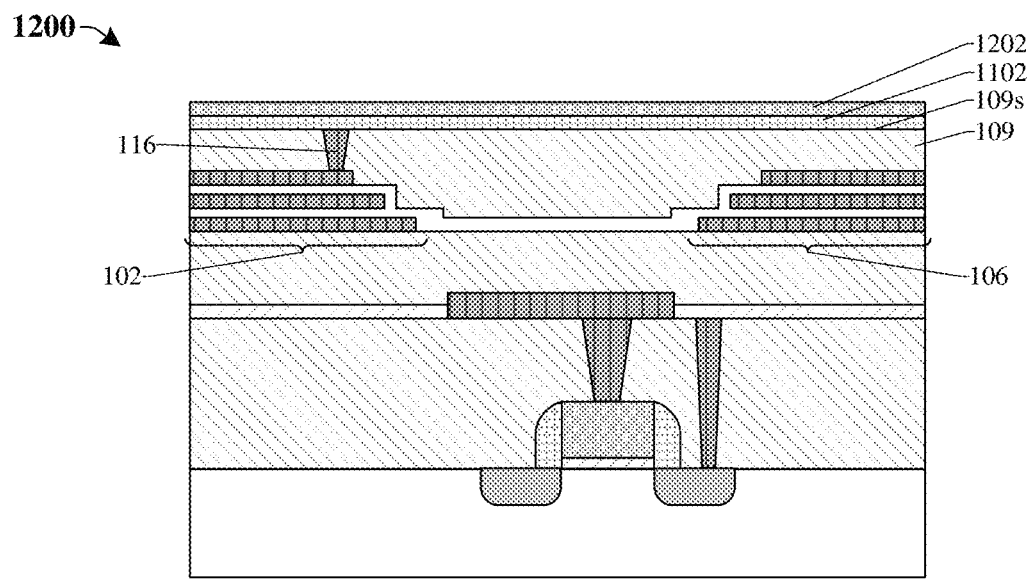

As shown in the cross-sectional view 1200 of FIG. 12, an un-patterned seed layer 1202 is formed over the first insulator 109. In some embodiments, the un-patterned seed layer 1202 is or comprises a metal, such as copper or the like. In some embodiments, due to the first insulator 109 having a substantially flat surface 109s, a top surface of the un-patterned seed layer 1202 is also substantially flat.

Figure 13:
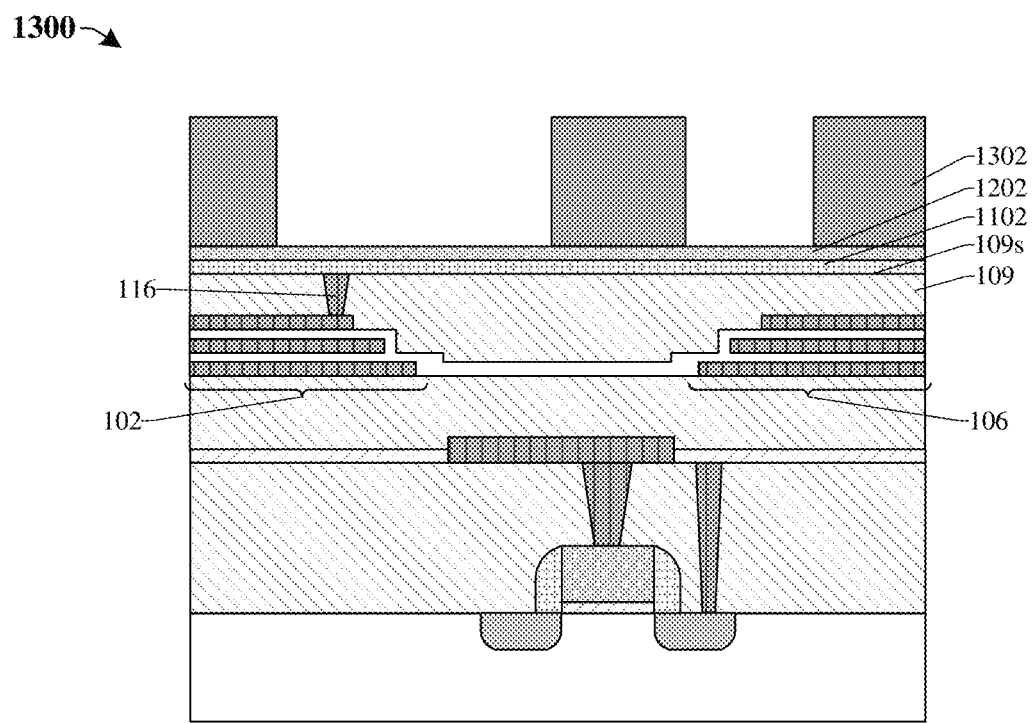

As shown in the cross-sectional view 1300 of FIG. 13, a masking layer 1302 (e.g., positive/negative photoresist, a hardmask, etc.) is formed on the un-patterned seed layer 1202. In some embodiments, the masking layer 1302 is formed by depositing an un-patterned masking layer (not shown) over the un-patterned seed layer 1202 (e.g., via a spin-on process). The un-patterned masking layer is then patterned (e.g., via a lithography process, such as extreme ultraviolet lithography, or the like), resulting in the masking layer 1302.

Figure 14:
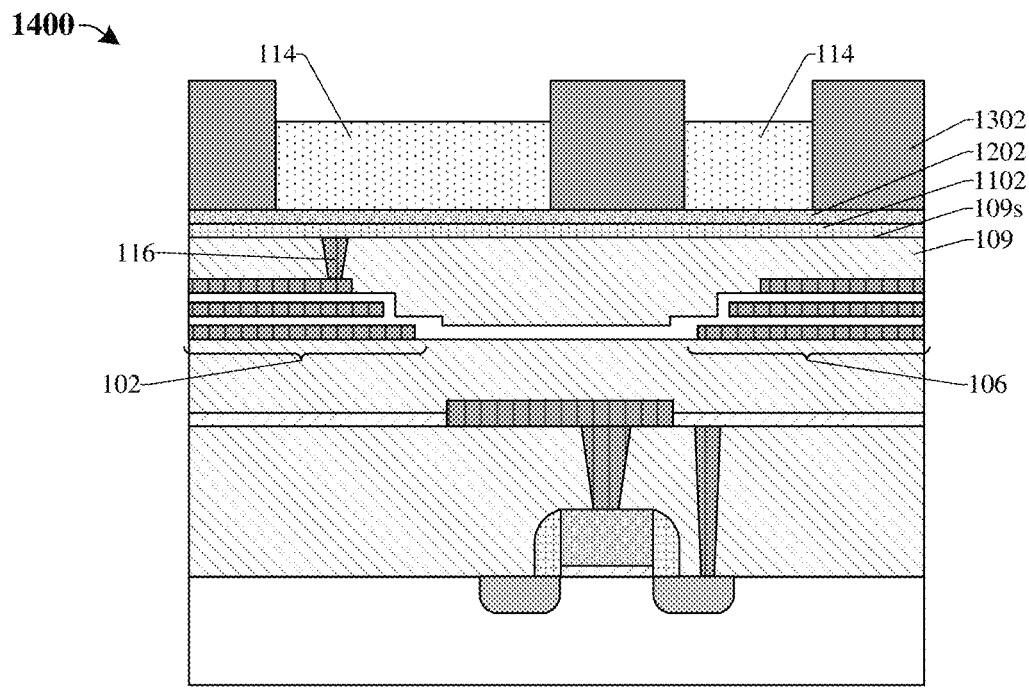

As shown in the cross-sectional view 1400 of FIG. 14, the metal core 114 is formed over the un-patterned seed layer 1202 according to the masking layer 1302. In some embodiments, the metal core 114 is or comprises a metal, such as copper or the like. The metal core 114 may be formed, for example, by using an electrochemical plating (ECP) process to grow an even layer of metal over the un-patterned seed layer 1202. Due to the uniformity of the ECP process and the top surface of the un-patterned seed layer 1202 being substantially flat, the top surface of the metal core 114 is also substantially flat.

Figure 15:
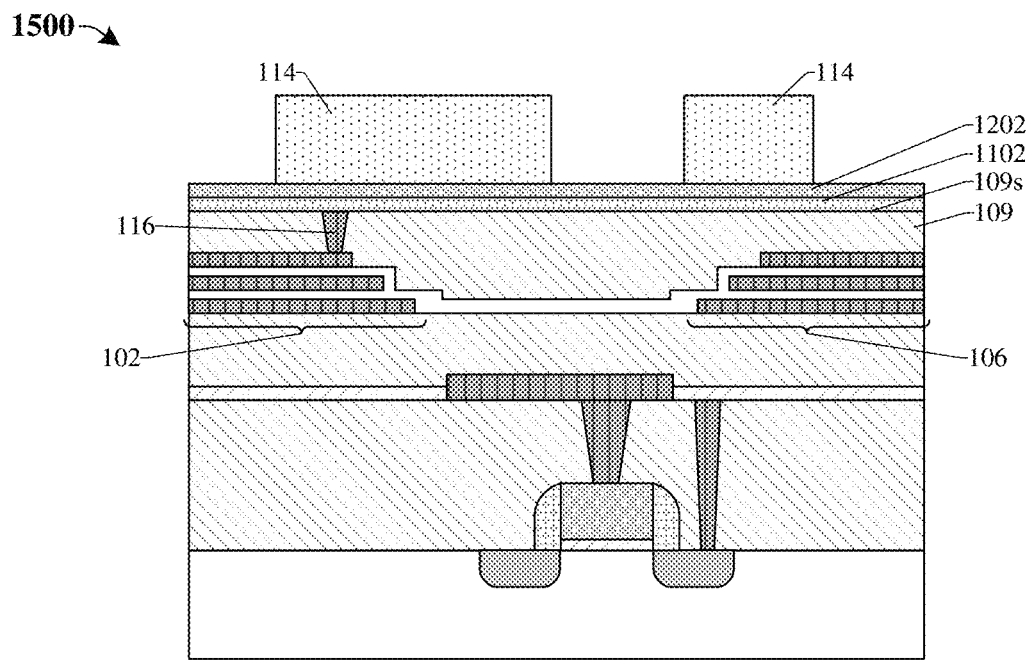

As shown in the cross-sectional view 1500 of FIG. 15, the masking layer 1302 is removed, leaving the metal core 114 extending out of the un-patterned seed layer 1202. The masking layer 1302 may be removed, for example, by any of one or more etching processes, one or more ashing processes, ultrasonic scrubbing, or some other processes.

Figure 16:
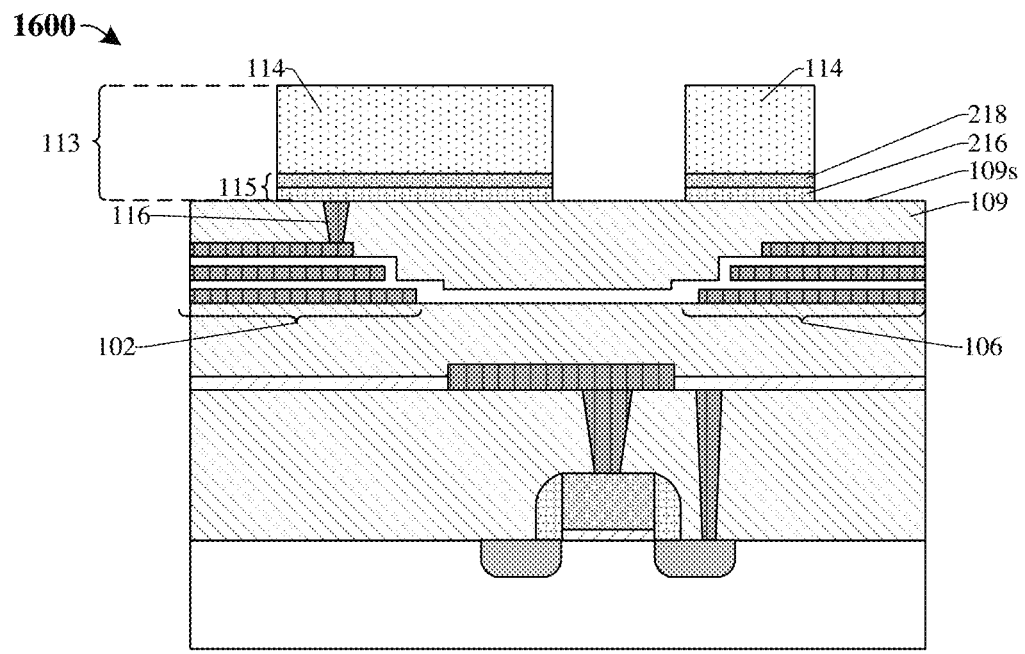

As shown in the cross-sectional view 1600 of FIG. 16, portions of the un-patterned seed layer (1202 of FIG. 15) and the un-patterned barrier layer (1102 of FIG. 15) are removed, resulting in the seed layer 218 and the first barrier layer 216. In some embodiments, the removed portions of the un-patterned seed layer 1202 and the un-patterned barrier layer 1102 are laterally adjacent to the metal core 114, which protects the resulting seed layer 218 and the first barrier layer 216 from removal. In some embodiments, the portions are removed using one of a dry etching process, a wet etching process, a plasma enhanced etching process, another similar process, or a combination of the foregoing. In some embodiments, a top surface of the metal core 114 is partially etched by the etching process, however, the top surface of the metal core 114 is still substantially flat due to the etching process not affecting a significant portion of the metal core 114. The thickness of the un-patterned seed layer 1202 and un-patterned barrier layer 1102 is significantly lower than the thickness of the metal core 114, such that the minimum etch required to remove the portions of the un-patterned seed layer 1202 and the un-patterned barrier layer 1102 will not strongly affect the resulting metal core 114. The remaining portions of the metal core 114, the seed layer 218, and the first barrier layer 216 form the conductive structure 113 having the base conductive layer 115 and the metal core 114.

Figure 17:
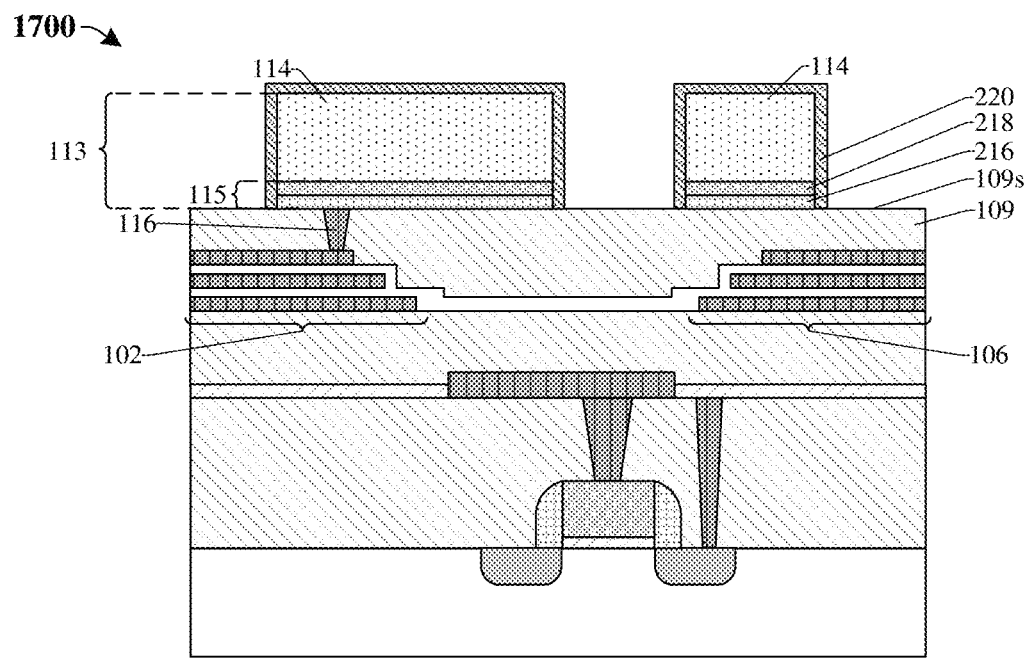

As shown in the cross-sectional view 1700 of FIG. 17, in some embodiments, the second barrier layer 220 is formed over the metal core 114. In some embodiments, the second barrier layer 220 is or comprises a metal, such as titanium (Ti) titanium nitrate (TiN), aluminum (Al), tantalum (Ta), tantalum nitrate (TaN), the like, or any combination of the foregoing. In some embodiments, the second barrier layer 220 comprises a same material as the first barrier layer 216. In some embodiments, the second barrier layer 220 is not formed over the metal core 114, and an anneal is performed to stabilize the conductive structure 113. In other embodiments, the second barrier layer 220 is not formed over the metal core 114, and an anneal is not performed.

Figure 18:
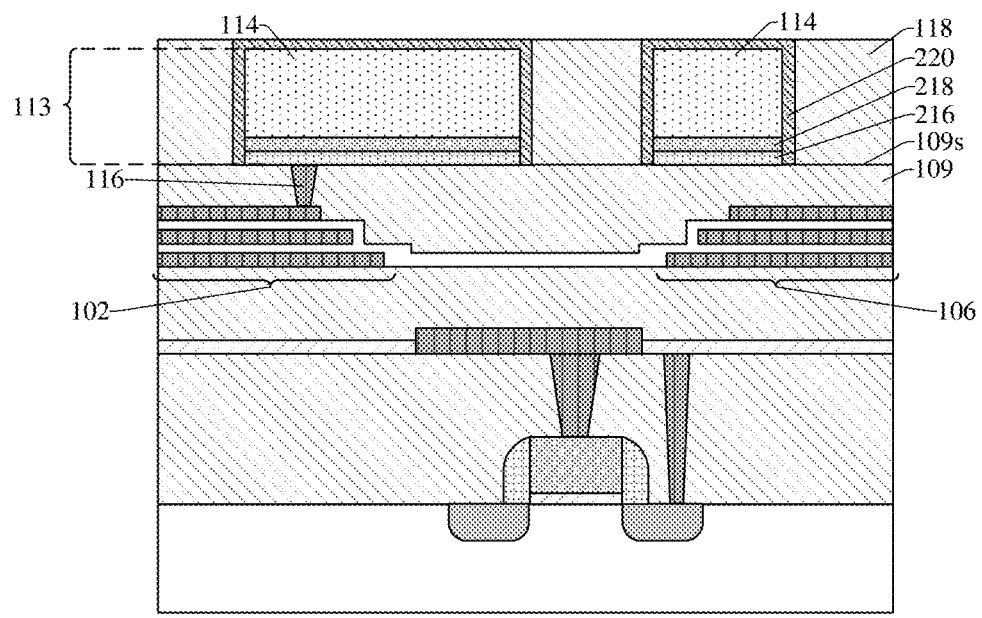

As shown in the cross-sectional view 1800 of FIG. 18, in some embodiments, the second insulator 118 is formed around the metal core 114. In some embodiments, the second insulator 118 may, for example, be formed by one or more deposition processes, such as a CVD process, or some other suitable process(es), and one or more planarization processes, such as a CMP process. In some embodiments, the second insulator 118 is or comprises an oxide (e.g., silicon dioxide), a low-κ dielectric material, an extreme low-κ dielectric material, the like or any combination of the foregoing. In some embodiments, the second insulator 118 is or comprises a same material as the first insulator 109. In some embodiments, the material of the second insulator 118 may prevent diffusion from the conductive structure 113 without the second barrier layer 220 or the anneal.

Figure 19:
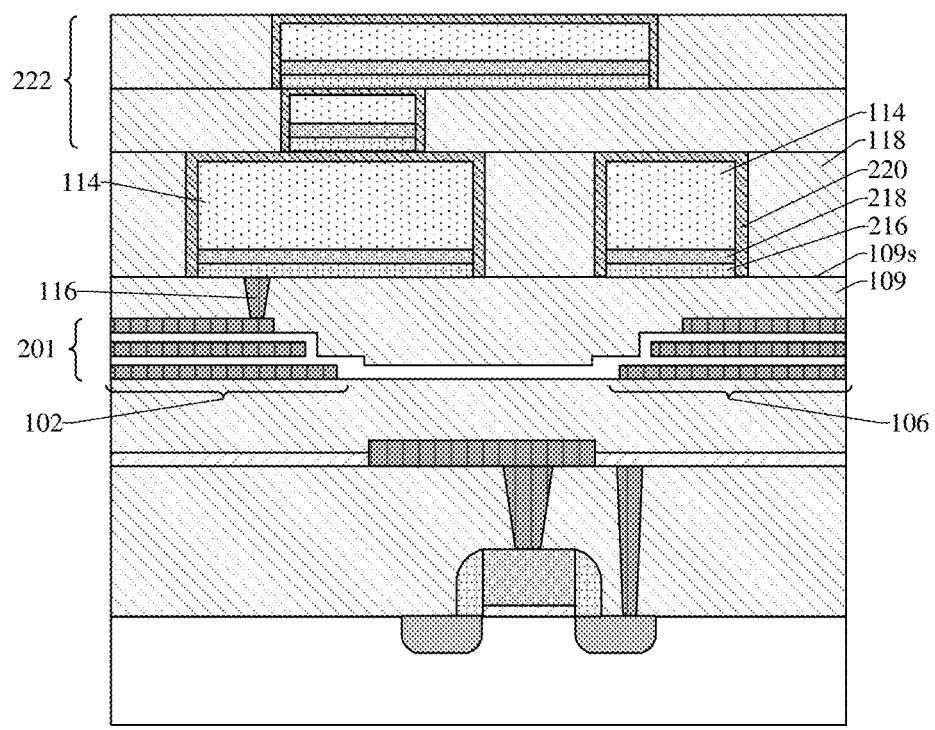

As shown in the cross-sectional view 1900 of FIG. 19, additional wire levels 222 may be formed over the second insulator 118. In some embodiments, steps similar to those shown in FIGS. 11-18 are repeated one or more times to form the additional wire levels 222. In some embodiments, the additional wire levels 222 are electrically coupled to one another and the plurality of MIM capacitors 201 to form a second interconnect structure.

Figure 20:
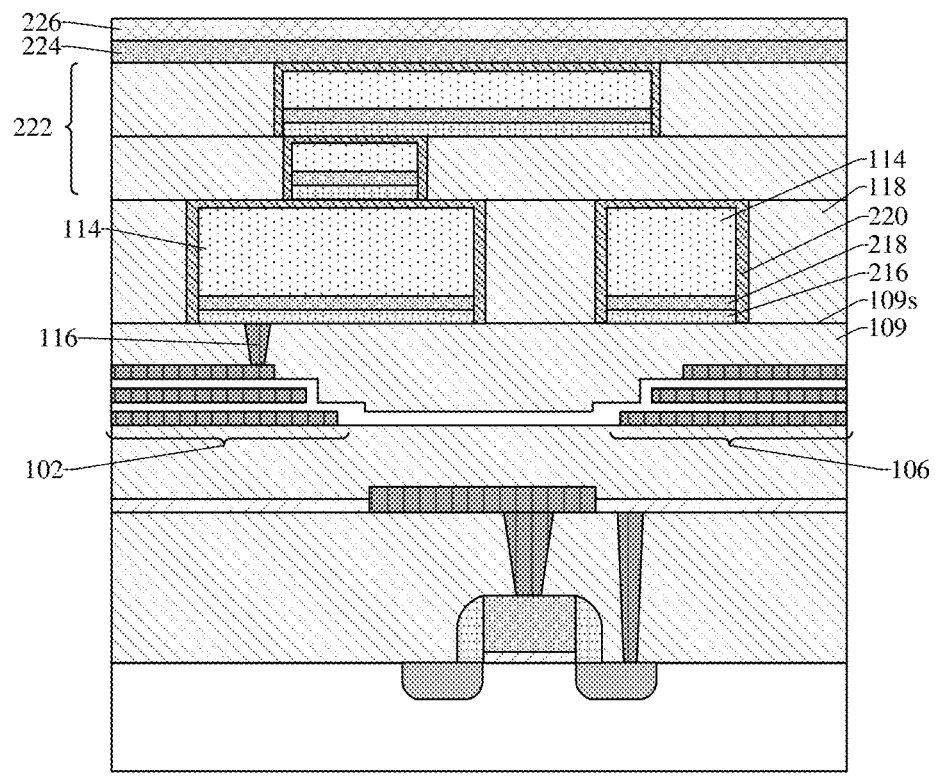

As shown in the cross-sectional view 2000 of FIG. 20, in some embodiments, the one or more passivation layers 224, 226 are formed on the additional wire levels 222. The one or more passivation layers 224, 226 are or comprise a nitride (e.g., silicon nitride), a carbide (e.g., silicon carbide), an oxide, or the like, or some combination of the above listed materials.

Figure 21:
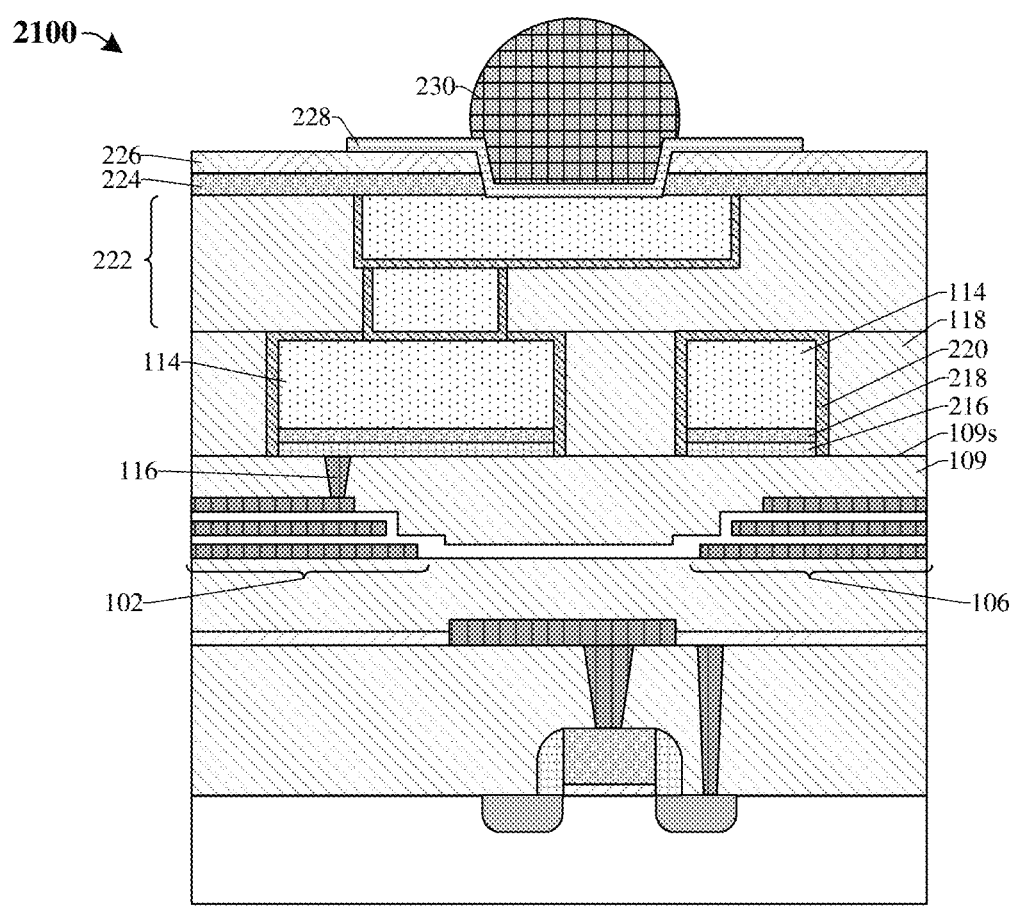

As shown in the cross-sectional view 2100 of FIG. 21, in some embodiments, the plurality of UBM structures 228 are formed on the one or more passivation layers 224, 226. In some embodiments, the plurality of UBM structures 228 include a diffusion barrier layer and a seed layer. The diffusion barrier layer may also function as an adhesion layer (or a glue layer), in some embodiments. The diffusion barrier layer may comprise tantalum, tantalum nitride, titanium, titanium nitride, or combination thereof. The seed layer comprises a material that is configured to enable deposition of metal posts, solder bumps, or the like. The plurality of UBM structures 228 extend through the one or more passivation layers 224, 226 and directly contact the additional wire levels 222. In some embodiments, a plurality of solder bumps 230 are formed on the plurality of UBM structures 228.

With reference to FIGS. 22 through 26, cross-sectional views of some embodiments of an alternative method of forming an MIM capacitor array with a metal core formed over a substantially flat surface. Although FIGS. 22 through 26 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 22:
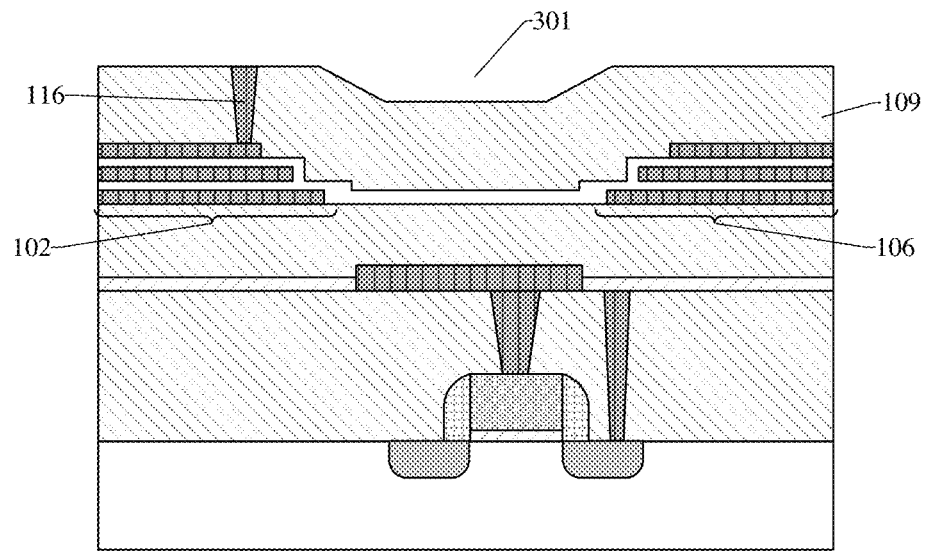
FIGS. 22 through 26 illustrate a series of cross-sectional views of some embodiments of an alternative method of forming an integrated chip comprising a conductive structure that has a metal core disposed over a base conductive layer including a substantially flat upper surface arranged over a MIM capacitor array.

As shown in the cross-sectional view 2200 of FIG. 22, in some embodiments, an integrated chip is provided as described in relation to FIGS. 6-8. The capacitor vias 116 are formed in the first insulator 109 using one or more etching steps and one or more deposition steps. The recess 301 extends into an upper surface of the first insulator 109.

Figure 23:
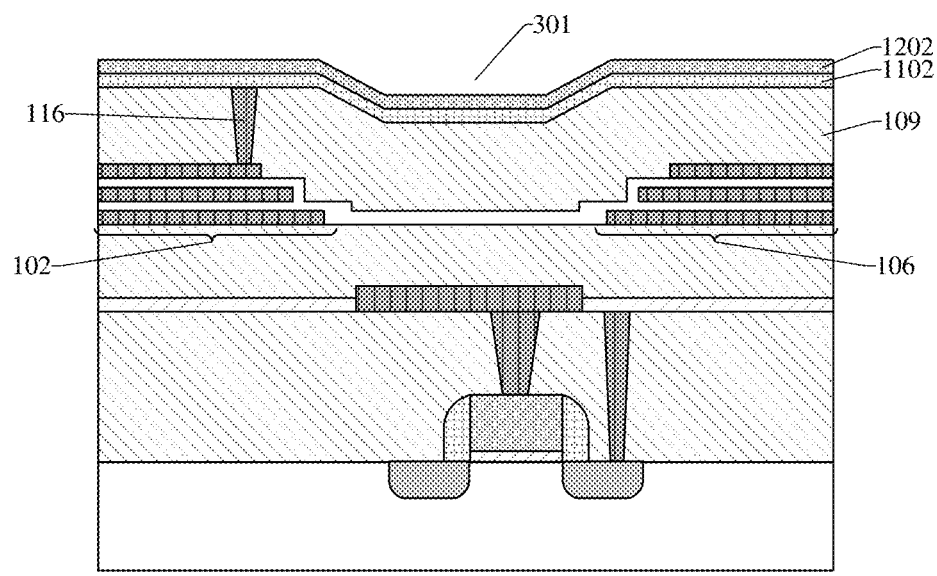

As shown in the cross-sectional view 2300 of FIG. 23, in some embodiments, the un-patterned barrier layer 1102 and the un-patterned seed layer 1202 are formed over the first insulator. The un-patterned barrier layer 1102 and the un-patterned seed layer 1202 extend into the recess 301.

Figure 24:
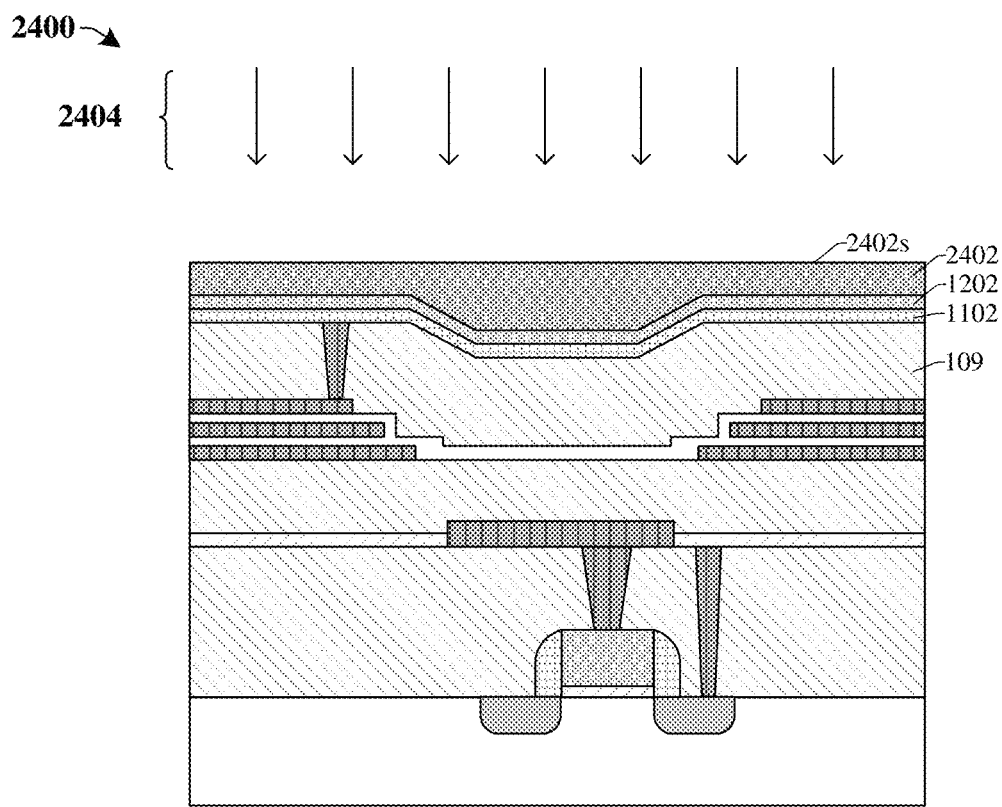

As shown in the cross-sectional view 2400 of FIG. 24, in some embodiments, an un-patterned intermediate conductive feature 2402 is formed over the un-patterned seed layer 1202. The un-patterned intermediate conductive feature 2402 is formed through an ECP process. After the un-patterned intermediate conductive feature 2402 is formed, a planarization process (e.g., a CMP process) 2404 is performed, resulting in the un-patterned intermediate conductive feature 2402 having a substantially flat upper surface 2402s. In some embodiments, the un-patterned intermediate conductive feature 2402 comprises a same material as the un-patterned seed layer 1202.

Figure 25:
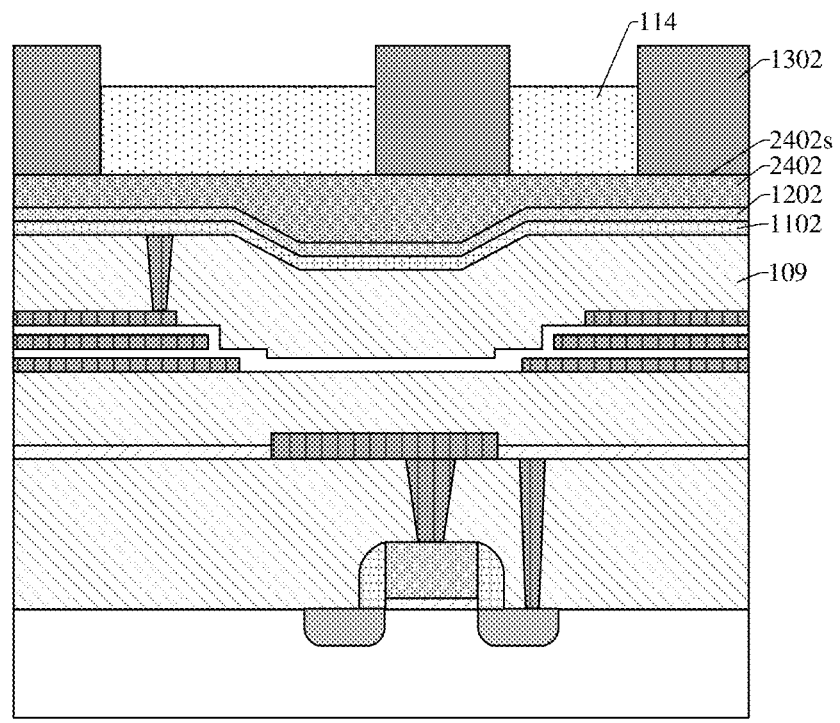

As shown in the cross-sectional view 2500 of FIG. 25, in some embodiments, the metal core 114 is formed over the un-patterned intermediate conductive feature 2402. The metal core 114 is patterned using the masking layer 1302. Due to the substantially flat upper surface 2402s of the un-patterned intermediate conductive feature 2402, the metal core 114 also has a substantially flat upper surface and a substantially flat lower surface.

Figure 26:
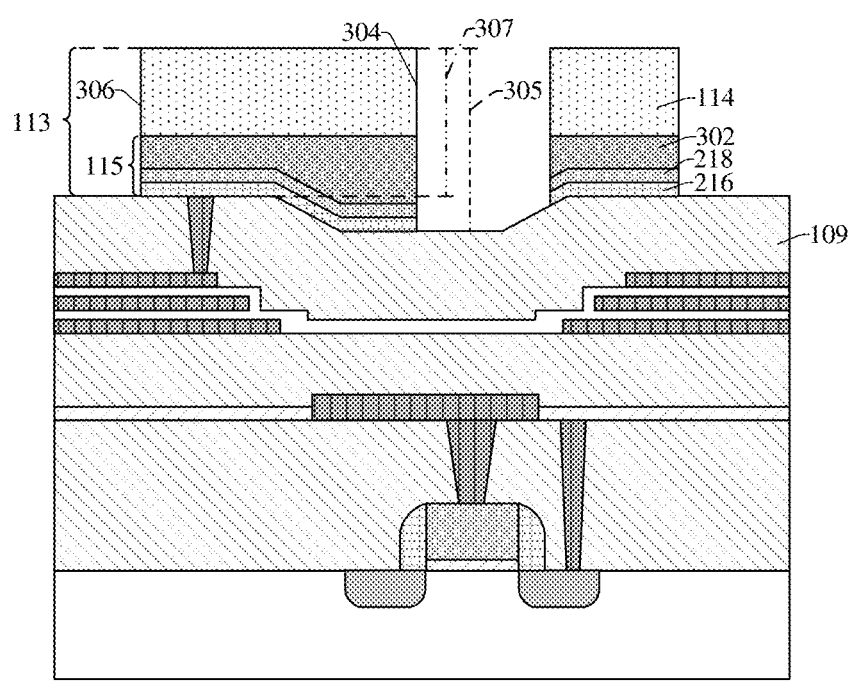

As shown in the cross-sectional view 2600 of FIG. 26, in some embodiments, portions of the un-patterned intermediate conductive feature 2402, the un-patterned seed layer 1202, and the un-patterned barrier layer 1102 are removed. The remaining portions of the metal core 114, the intermediate conductive feature 302, the seed layer 218, and the first barrier layer 216 form a conductive structure 113 having a base conductive layer 115 and the metal core 114. The base conductive layer 115 has a substantially flat upper surface. In some embodiments, the conductive structure 113 has a first outermost sidewall 304 and an opposing second outermost sidewall 306, the first outermost sidewall 304 being laterally between the first MIM capacitor 102 and the second MIM capacitor 106 and having a first height 305 that is greater than a second height 307 of the second outermost sidewall 306. In some embodiments, the process continues in a manner similar to that shown in FIGS. 17-21.

With reference to FIGS. 27 through 30, cross-sectional views of some embodiments of an alternative method of forming an MIM capacitor array with a conductive structure 113 formed over a substantially flat surface. Although FIGS. 27 through 30 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 27:
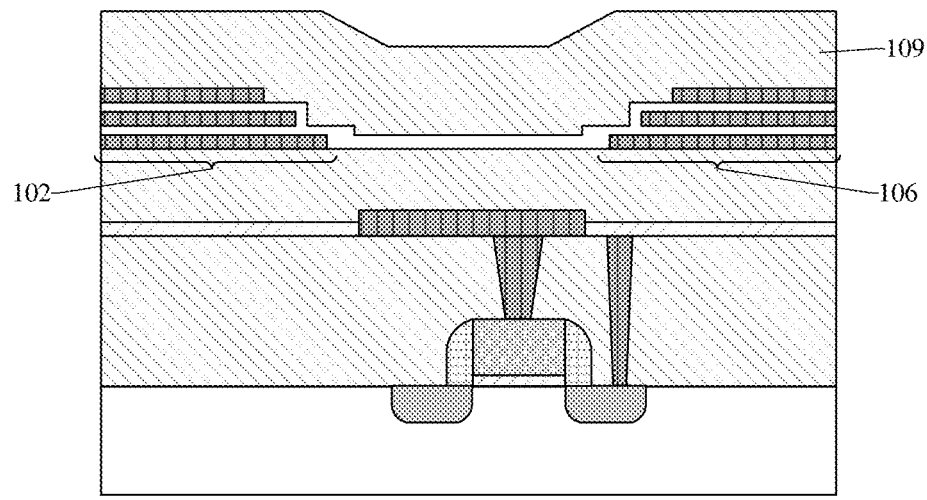
FIGS. 27 through 30 illustrate a series of cross-sectional views of some embodiments of an alternative method of forming an integrated chip comprising a conductive structure that has a metal core disposed over a base conductive layer including a substantially flat upper surface arranged over a MIM capacitor array.

As shown in the cross-sectional view 2700 of FIG. 27, an integrated chip is provided as described in relation to FIGS. 6-8. The first insulator 109 is formed over and between the first MIM capacitor 102 and the second MIM capacitor 106.

Figure 28:
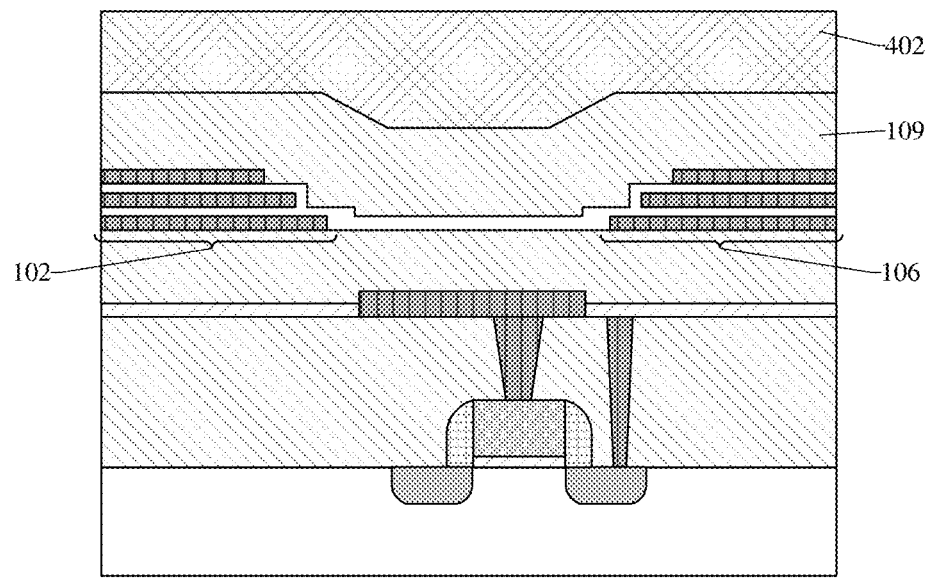

As shown in the cross-sectional view 2800 of FIG. 28, in some embodiments, a planarization layer 402 is formed over the first insulator 109. In some embodiments, the planarization layer 402 is or comprises an oxide (e.g., silicon dioxide), a low-κ dielectric material, an extreme low-κ dielectric material, the like or any combination of the foregoing. In some embodiments, the planarization layer 402 is a same material as the first insulator 109. In other embodiments, the planarization layer 402 is a different material from the first insulator 109. In some embodiments, the first insulator 109 is an oxide formed using a high-density plasma (HDP) CVD process and the planarization layer 402 is an oxide formed using a plasma enhanced (PE) CVD process. That is, the first insulator 109 is or comprises an HDP-CVD oxide and the planarization layer 402 is or comprises a PE-CVD oxide.

Figure 29:
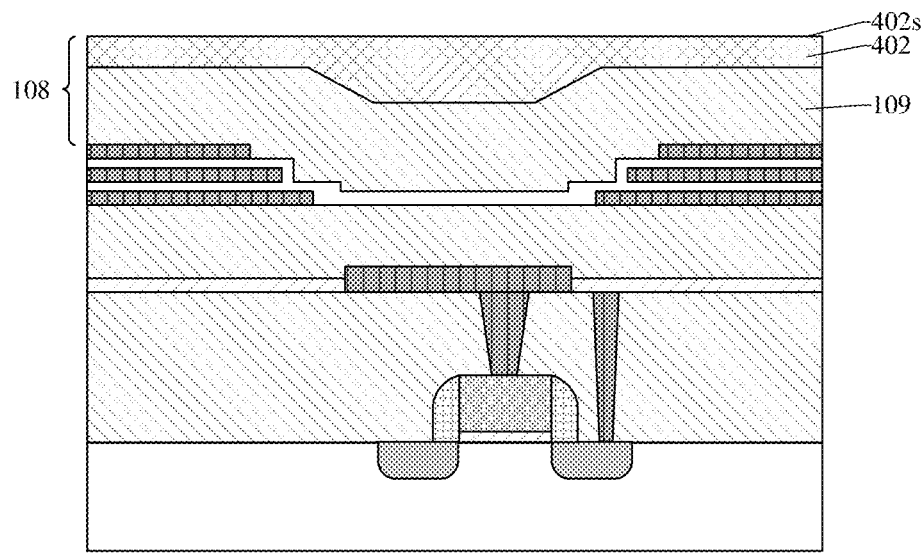

As shown in the cross-sectional view 2900 of FIG. 29, in some embodiments, a planarization process (e.g., a CMP process) 2902 is performed on the planarization layer 402, resulting in the planarization layer 402 having a substantially flat surface 402s. The remaining planarization layer 402 and the first insulator 109 together form the dielectric structure 108.

Figure 30:
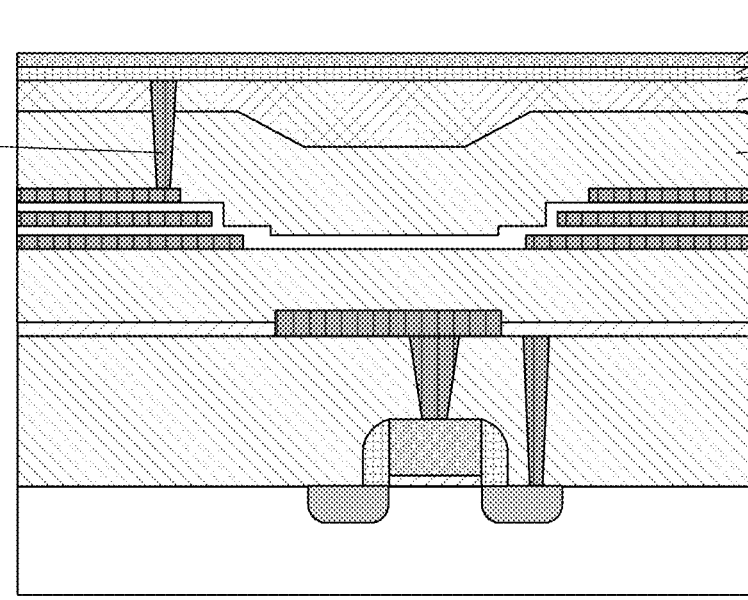

As shown in the cross-sectional view 3000 of FIG. 30, in some embodiments, the capacitor vias 116 are formed extending through the dielectric structure 108. Additionally, the un-patterned barrier layer 1102 and the un-patterned seed layer 1202 are formed over the substantially flat surface 402s of the planarization layer 402. In some embodiments, the process continues in a manner similar to that shown in FIGS. 13-21.

Figure 31:
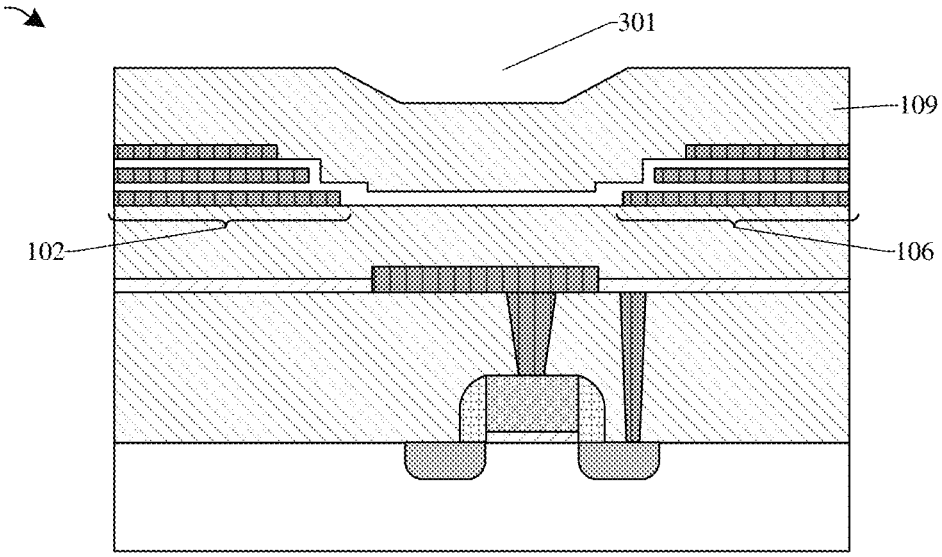
FIGS. 31 through 33 illustrate a series of cross-sectional views of some embodiments of an alternative method of forming an integrated chip comprising a conductive structure that has a metal core disposed over a base conductive layer including a substantially flat upper surface arranged over a MIM capacitor array.
Figure 32:
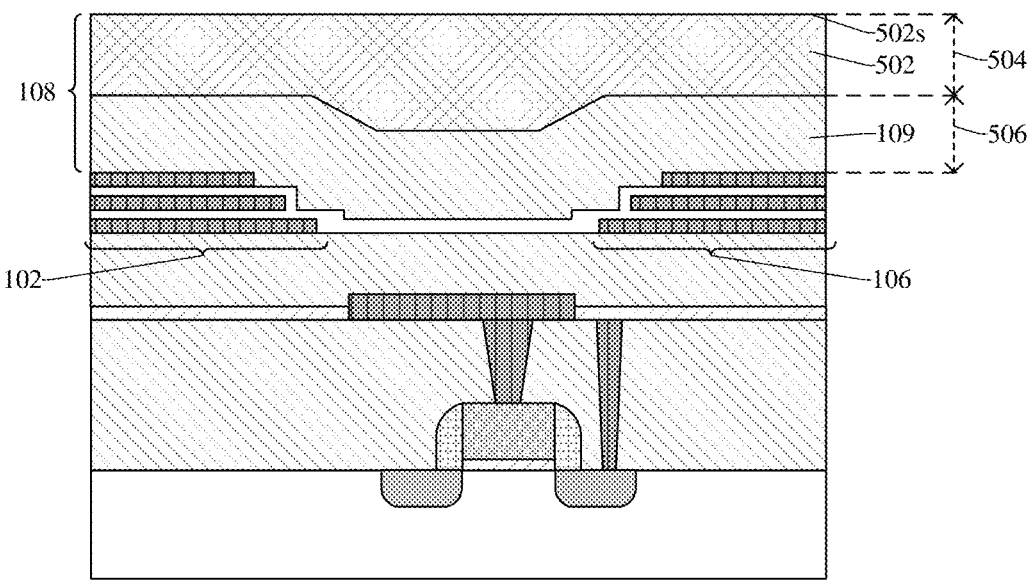
Figure 33:
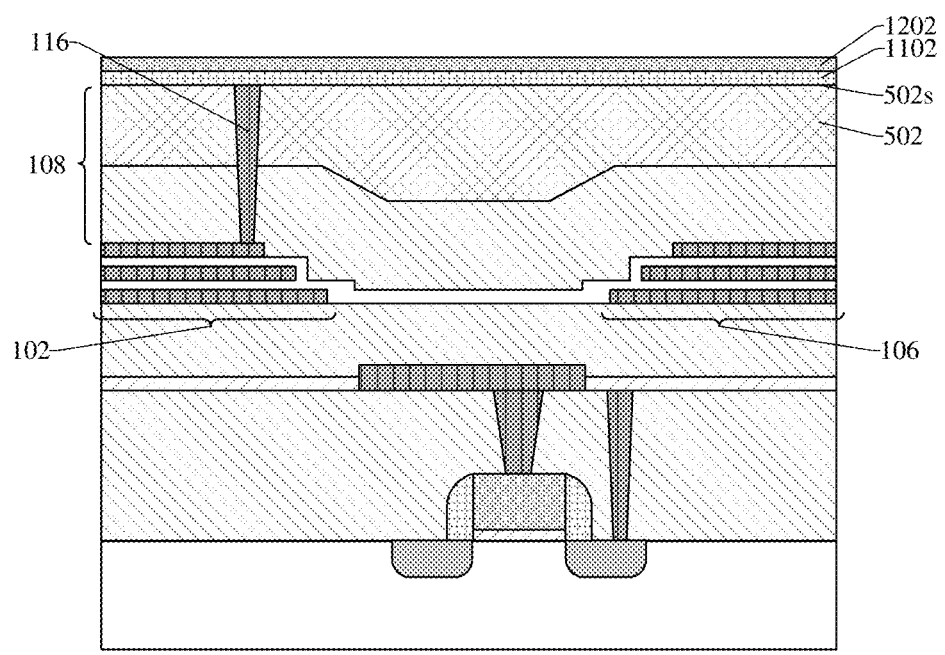

With reference to FIGS. 31 through 33, cross-sectional views of some embodiments of an alternative method of forming an MIM capacitor array with a conductive structure formed over a substantially flat surface. Although FIGS. 31 through 33 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

As shown in the cross-sectional view 3100 of FIG. 31, an integrated chip is provided as described in relation to FIGS. 6-8. The first insulator 109 is formed over and between the first MIM capacitor 102 and the second MIM capacitor 106. The recess 301 extends into the upper surface of the first insulator 109 between the first MIM capacitor 102 and the second MIM capacitor 106.

As shown in the cross-sectional view 3200 of FIG. 32, in some embodiments, the second planarization layer 502 is formed over the first insulator 109. In some embodiments, the second planarization layer 502 has a first thickness 504 and the first insulator 109 has a second thickness 506, and the first thickness 504 is greater than the second thickness 506. In some embodiments, the second planarization layer 502 has a greater maximum thickness than the first insulator. The enhanced thickness 504 of the second planarization layer 502 results in the recess (301 of FIG. 31) being filled as well as the second planarization layer 502 having a substantially flat surface 502s. The second planarization layer 502 and the first insulator 109 together form the dielectric structure 108.

As shown in the cross-sectional view 3300 of FIG. 33, in some embodiments, the capacitor vias 116 are formed extending through the dielectric structure 108. Additionally, the un-patterned barrier layer 1102 and the un-patterned seed layer 1202 are formed over the substantially flat surface 502s of the second planarization layer 502. In some embodiments, the process continues in a manner similar to that shown in FIGS. 13-21.

Figure 34:
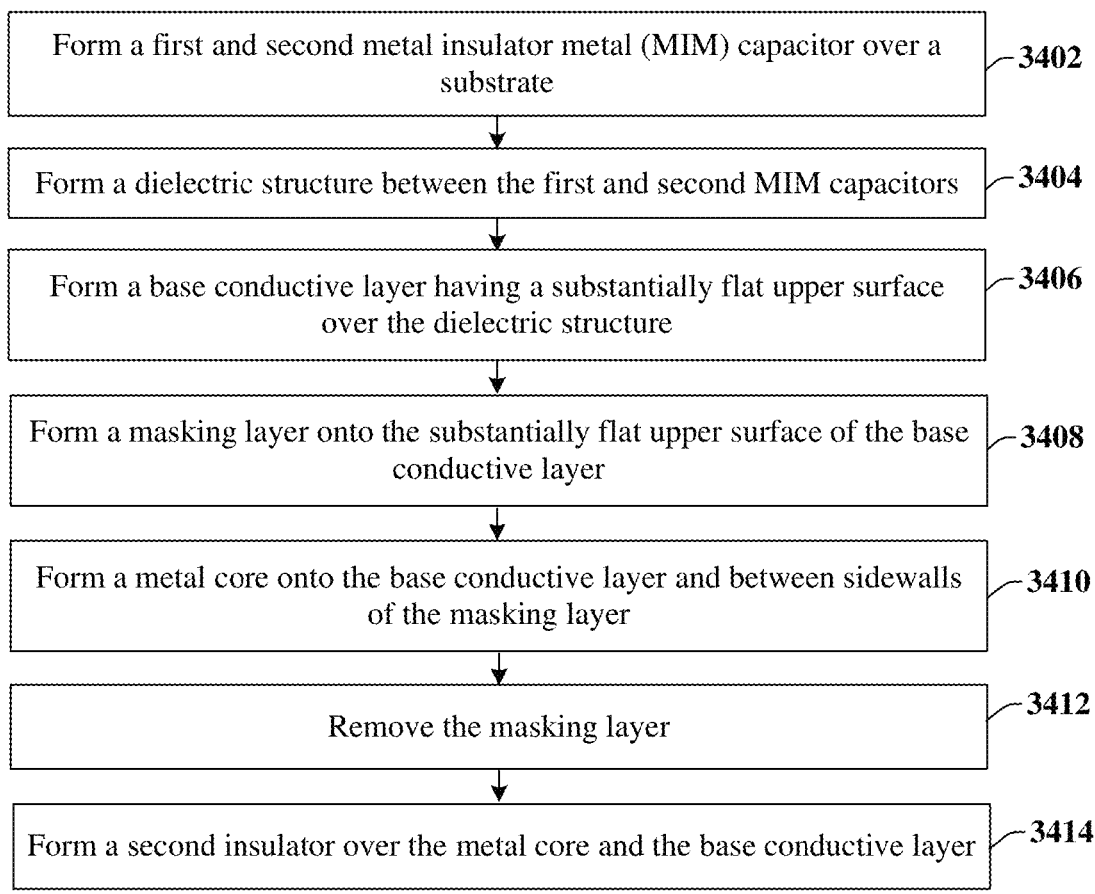
FIG. 34 illustrates a flow diagram of some embodiments of an alternative method of forming an integrated chip comprising a conductive structure that has a metal core disposed over a base conductive layer including a substantially flat upper surface arranged over a MIM capacitor array.

FIG. 34 illustrates a flow diagram 3400 of some embodiments of a method of forming an MIM capacitor array with a conductive structure formed over a substantially flat surface. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 3402, a first and second metal insulator metal (MIM) capacitor are formed over a substrate. FIG. 7 illustrates a cross-sectional view 700 of some embodiments corresponding to act 3402.

At 3404, a dielectric structure is formed between the first and second MIM capacitors. FIGS. 8-9 illustrate cross-sectional views 800-900 of some embodiments corresponding to act 3404.

At 3406, a base conductive layer having a substantially flat upper surface is formed over the dielectric structure. FIGS. 11-12 illustrate cross-sectional views 1100-1200 of some embodiments corresponding to act 3406.

At 3408, a masking layer is formed onto the substantially flat upper surface of the base conductive layer. FIG. 13 illustrates a cross-sectional view 1300 of some embodiments corresponding to act 3408.

At 3410, a metal core is formed onto the base conductive layer and between sidewalls of the masking layer. FIG. 14 illustrates a cross-sectional view 1400 of some embodiments corresponding to act 3410.

At 3412, the masking layer is removed. FIG. 15 illustrates a cross-sectional view 1500 of some embodiments corresponding to act 3412.

At 3414, a second insulator is formed over the metal core and the base conductive layer. FIG. 18 illustrates a cross-sectional view 1800 of some embodiments corresponding to act 3414.

Therefore, the present disclosure relates to a method of forming a pixel array including a substrate contact on the backside of the wafer to increase pixel scalability without increasing the leakage between the floating diffusion region and the body contact region.

Some embodiments relate to an integrated chip including a first metal insulator metal (MIM) capacitor disposed over a substrate. The integrated chip further includes a second MIM capacitor disposed over the substrate. The first MIM capacitor has a first outer sidewall facing a second outer sidewall of the second MIM capacitor. A dielectric structure is arranged over and laterally between the first MIM capacitor and the second MIM capacitor. A base conductive layer is arranged between the first MIM capacitor and the second MIM capacitor and has a substantially flat upper surface. A metal core arranged on the substantially flat upper surface of the base conductive layer.

Other embodiments relate to a pixel array including a dielectric structure on a substrate. A first metal insulator metal (MIM) capacitor and a second MIM capacitor are between the dielectric structure and the substrate. The first MIM capacitor and the second MIM capacitor are separated by a portion of the dielectric structure. A conductive structure extends over the portion of the dielectric structure. A first barrier layer spaces the conductive structure from the dielectric structure. The conductive structure comprises a seed layer and a metal core, wherein a bottommost surface of the metal core is substantially flat.

Some other embodiments relate to a method of forming an integrated chip that includes forming a first and second metal insulator metal (MIM) capacitor over a substrate. A dielectric structure is formed between the first and second MIM capacitors. A base conductive layer having a substantially flat upper surface is formed over the dielectric structure. A masking layer is formed onto the substantially flat upper surface of the base conductive layer. A metal core is formed onto the base conductive layer and between sidewalls of the masking layer. The masking layer is then removed. A second insulator is formed over the metal core and the base conductive layer.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, the method comprising:
   forming a first and second metal insulator metal (MIM) capacitor over a substrate;
   forming a dielectric structure between the first and second MIM capacitors;
   forming a base conductive layer having a substantially flat upper surface over the dielectric structure;
   forming a masking layer onto the substantially flat upper surface of the base conductive layer;
   forming a metal core onto the base conductive layer and between sidewalls of the masking layer;
   removing the masking layer; and
   forming a second insulator over the metal core and the base conductive layer.

2. The method of claim 1, wherein forming the base conductive layer further comprises:
   forming a first barrier layer over the dielectric structure;
   forming a seed layer over the first barrier layer, the seed layer being directly over the first MIM capacitor and the second MIM capacitor and extending into a recess in the dielectric structure between the first MIM capacitor and the second MIM capacitor; and growing an intermediate conductive feature over the seed layer;
  wherein the intermediate conductive feature has a bottom surface that extends into the recess.

3. The method of claim 1, further comprising removing portions of the base conductive layer after the masking layer is removed, such that remaining portions of the base conductive layer are entirely beneath the metal core.

4. The method of claim 1, wherein the second insulator directly contacts the metal core.

5. The method of claim 1, wherein the base conductive layer has a first thickness at portions above the first MIM capacitor and a second thickness at portions overlying portions of the dielectric structure directly between the first and second MIM capacitors.

6. The method of claim 1, wherein the base conductive layer has lower surfaces that extend in a direction diagonal to the substantially flat upper surface when viewed from a cross-sectional perspective.

7. The method of claim 1, wherein the dielectric structure has a recess extending between the first MIM capacitor and the second MIM capacitor, and wherein after the base conductive layer is formed, the base conductive layer fills the recess.

8. A method of forming an integrated device, comprising:
  forming a first metal insulator metal (MIM) capacitor and a second MIM capacitor over a substrate;
  depositing a first insulator over the first and second MIM capacitors, the first insulator having a first recess in a portion of an upper surface of the first insulator extending between the first MIM capacitor and the second MIM capacitor;
  forming a base conductive layer over the first insulator, the base conductive layer extending from the first MIM capacitor to the second MIM capacitor;
  forming a masking layer on the base conductive layer, the masking layer having a substantially flat bottom surface;
  patterning the masking layer to form a plurality of openings in the masking layer that expose portions of the base conductive layer;
  performing an electrochemical plating (ECP) process resulting in a plurality of metal cores lining exposed portions of the base conductive layer;
  removing the masking layer; and
  removing portions of the base conductive layer extending between the metal cores.

9. The method of claim 8, wherein the base conductive layer has a first thickness at portions above the first MIM capacitor and a second thickness at portions overlying the first recess.

10. The method of claim 8, wherein after the ECP process, a first metal core extends from a point overlying the first MIM capacitor to a point overlying the first recess in the first insulator, and wherein the first metal core is spaced from the first recess in the first insulator by the base conductive layer.

11. The method of claim 8, wherein the base conductive layer has a first lower surface a first distance from the substrate and a second lower surface a second distance from the substrate, wherein the first distance is greater than the second distance.

12. The method of claim 11, further comprising forming a via extending through the first insulative layer before forming the base conductive layer, wherein after forming the base conductive layer the via extends past the second lower surface of the base conductive layer to the first lower surface.

13. The method of claim 8, wherein before forming the masking layer, the base conductive layer has a substantially flat top surface that extends from directly over the first MIM capacitor to directly over the second MIM capacitor.

14. A method of forming an integrated device, the method comprising:
  forming a first metal insulator metal (MIM) capacitor over a substrate;
  depositing a first insulator over the first MIM capacitor, the first insulator having a first upper surface directly overlying the first MIM capacitor and a second upper surface spaced from the first MIM capacitor in a first direction parallel to an upper surface of the substrate;
  forming a via extending through the first insulator to the first MIM capacitor;
  forming a base conductive layer over the first insulator, the base conductive layer having a substantially flat upper surface extending in the first direction from the via to the second upper surface of the first insulator;
  forming a masking layer on the substantially flat upper surface of the base conductive layer, the masking layer comprising a photoresist;
  patterning the masking layer to form an opening in the masking layer that exposes a first portion of the base conductive layer;
  performing an electrochemical plating (ECP) process resulting in a metal core lining exposed portions of the base conductive layer;
  removing the masking layer, thereby exposing second portions of the base conductive layer; and
  removing the second portions of the base conductive layer.

15. The method of claim 14, further comprising forming a barrier layer over an upper surface and outer sidewalls of the metal core and a remaining portion of the base conductive layer after removing the second portions of the base conductive layer.

16. The method of claim 14, wherein the base conductive layer has a first lower surface on the first upper surface of the first insulator and a second lower surface on the second upper surface of the first insulator.

17. The method of claim 14, wherein forming the base conductive layer further comprises:
  forming a first barrier layer over the first insulator; and
  forming a seed layer over the first barrier layer.

18. The method of claim 17, wherein the seed layer extends over the second upper surface of the first insulator;
  wherein forming the base conductive layer further comprises growing an intermediate conductive feature over the seed layer; and
  wherein the intermediate conductive feature extends over the first upper surface and the second upper surface of the first insulator and has the substantially flat upper surface.

19. The method of claim 17, wherein after the second portions of the base conductive layer are removed, a conductive structure comprising the base conductive layer and the metal core remains on the substrate, wherein the first barrier layer comprises a first material, the seed layer and the metal core comprise a second material different from the first material, and wherein the seed layer is separated from the first insulator by the first barrier layer.

20. The method of claim 19, wherein after the second portions of the base conductive layer are removed, the conductive structure has a first outermost sidewall with a first height and facing towards the first MIM capacitor and a second outermost sidewall facing away from the first MIM capacitor with a second height that is greater than the first height.

* * * * *